US012451880B2

(12) United States Patent
Maeda et al.

(10) Patent No.: US 12,451,880 B2
(45) Date of Patent: Oct. 21, 2025

(54) ON-STATE VOLTAGE MEASUREMENT CIRCUIT

(71) Applicant: Panasonic Intellectual Property Management Co., Ltd., Osaka (JP)

(72) Inventors: Ryosuke Maeda, Osaka (JP); Yusuke Kinoshita, Kyoto (JP); Satoshi Nakazawa, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 154 days.

(21) Appl. No.: 18/546,741

(22) PCT Filed: Feb. 22, 2022

(86) PCT No.: PCT/JP2022/007123
§ 371 (c)(1),
(2) Date: Aug. 16, 2023

(87) PCT Pub. No.: WO2022/181581
PCT Pub. Date: Sep. 1, 2022

(65) Prior Publication Data
US 2024/0313759 A1    Sep. 19, 2024

(30) Foreign Application Priority Data
Feb. 25, 2021 (JP) .................. 2021-029259

(51) Int. Cl.
*H03K 17/082* (2006.01)
(52) U.S. Cl.
CPC ................. *H03K 17/0822* (2013.01)
(58) Field of Classification Search
CPC ................. H03K 17/0812–0828
See application file for complete search history.

(56) References Cited

U.S. PATENT DOCUMENTS 5,561,393 A * 10/1996 Sakurai ............ H03K 17/567
257/E29.198
5,903,422 A    5/1999 Hosokawa
(Continued)

FOREIGN PATENT DOCUMENTS

JP    H10-014099 A    1/1998
JP    H11-285238 A    10/1999
(Continued)

OTHER PUBLICATIONS

International Search Report dated May 17, 2022 issued in International Patent Application No. PCT/JP2022/007123, with English translation.

*Primary Examiner* — Thienvu V Tran
*Assistant Examiner* — Christopher J Clark
(74) *Attorney, Agent, or Firm* — Rimon P.C.

(57) ABSTRACT

An on-state voltage measurement circuit includes a detecting switch element, a control unit, a resistive element, and a voltage detection unit. The control unit includes a signal output terminal and a reference potential terminal and controls the detecting switch element. The resistive element is connected between a source terminal of the detecting switch element and the reference potential terminal. A resistance value of the resistive element is greater than an on-state resistance of the detecting switch element. The control unit turns the detecting switch element on when the semiconductor switch element is turned on. The voltage detection unit detects, based on a voltage across the resistive element when the semiconductor switch element and the detecting switch element are both on, the on-state voltage of the semiconductor switch element connected between a drain terminal of the detecting switch element and the reference potential terminal.

6 Claims, 25 Drawing Sheets

(56) References Cited

U.S. PATENT DOCUMENTS

| | | | |
|---|---|---|---|
| 6,285,235 B1 | 9/2001 | Ichikawa et al. | |
| 2010/0097105 A1 | 4/2010 | Morita et al. | |
| 2017/0170824 A1 | 6/2017 | Du et al. | |
| 2020/0182725 A1* | 6/2020 | Matsunami | G01D 3/08 |

FOREIGN PATENT DOCUMENTS

| | | |
|---|---|---|
| JP | 2002-369512 A | 12/2002 |
| JP | 2010-035284 A | 2/2010 |
| JP | 2012-085131 A | 4/2012 |
| JP | 2015-032984 A | 2/2015 |
| WO | 2008/062800 A1 | 5/2008 |

\* cited by examiner

ON-STATE VOLTAGE MEASUREMENT CIRCUIT

CROSS-REFERENCE OF RELATED APPLICATIONS

This application is the U.S. National Phase under 35 U.S.C. § 371 of International Patent Application No. PCT/JP2022/007123, filed on Feb. 22, 2022, which in turn claims the benefit of Japanese Patent Application No. 2021-029259, filed on Feb. 25, 2021, the entire disclosures of which Applications are incorporated by reference herein.

TECHNICAL FIELD

The present disclosure generally relates to an on-state voltage measurement circuit, and more particularly relates to an on-state voltage measurement circuit for measuring the on-state voltage of a semiconductor switch element.

BACKGROUND ART

Patent Literature 1 discloses a protection circuit for protecting a semiconductor switching element (semiconductor switch element) from a short-circuit current. The semiconductor switching element may be, for example, an IGBT.

The protection circuit includes a short-circuit detection unit for outputting a short-circuit detection signal on detecting a short-circuit based on a voltage between main electrodes of a semiconductor switching element (i.e., a collector-emitter voltage) and a control voltage for the semiconductor switching element. In this case, the protection circuit includes a diode for detecting the voltage between the main electrodes of the semiconductor switching element.

In the protection circuit of Patent Literature 1, the short-circuit detection unit receives a voltage that is the sum of the on-state voltage of the semiconductor switching element and a forward voltage of a diode, and therefore, the forward voltage of the diode needs to be known to the short-circuit detection unit. If the on-state voltage of the target of measurement is relatively small, then there is a concern that a variation in the forward voltage of the diode may significantly affect the measurement accuracy of the on-state voltage.

CITATION LIST

Patent Literature

Patent Literature 1: JP 2015-32984 A

SUMMARY OF INVENTION

An object of the present disclosure is to provide an on-state voltage measurement circuit contributing to improving the measurement accuracy of an on-state voltage.

An on-state voltage measurement circuit according to an aspect of the present disclosure measures an on-state voltage of a semiconductor switch element including a control terminal, a first main terminal, and a second main terminal. The on-state voltage is a voltage between the first main terminal and the second main terminal of the semiconductor switch element in an on state. The on-state voltage measurement circuit includes a detecting switch element, a control unit, a resistive element, and a voltage detection unit. The detecting switch element includes a drain terminal, a source terminal, and a gate terminal. The control unit includes a signal output terminal and a reference potential terminal and controls the detecting switch element. The resistive element is connected between the source terminal and the reference potential terminal. A resistance value of the resistive element is greater than an on-state resistance of the detecting switch element. The voltage detection unit detects, based on a voltage across the resistive element when the semiconductor switch element and the detecting switch element are both on, the on-state voltage of the semiconductor switch element connected between the drain terminal and the reference potential terminal.

An on-state voltage measurement circuit according to another aspect of the present disclosure measures an on-state voltage of a semiconductor switch element including a first control terminal, a first main terminal corresponding to the first control terminal, a second control terminal, and a second main terminal corresponding to the second control terminal. The on-state voltage is a voltage between the first main terminal and the second main terminal of the semiconductor switch element in an on state. The on-state voltage measurement circuit includes a first detecting switch element, a first control unit, a first resistive element, a first voltage detection unit, a second detecting switch element, a second control unit, a second resistive element, and a second voltage detection unit. The first detecting switch element includes a first drain terminal, a first source terminal, and a first gate terminal. The first control unit includes a first signal output terminal and a first reference potential terminal and controls the first detecting switch element. The first resistive element is connected between the first source terminal and the first reference potential terminal. The second detecting switch element includes a second drain terminal, a second source terminal, and a second gate terminal. The second control unit includes a second signal output terminal and a second reference potential terminal and controls the second detecting switch element. The second resistive element is connected between the second source terminal and the second reference potential terminal. In the on-state voltage measurement circuit, the first drain terminal of the first detecting switch element and the second drain terminal of the second detecting switch element are connected to each other. A resistance value of the first resistive element is greater than an on-state resistance of the first detecting switch element. A resistance value of the second resistive element is greater than an on-state resistance of the second detecting switch element. The first voltage detection unit detects, based on a voltage across the first resistive element when the semiconductor switch element and the first detecting switch element are both on, the on-state voltage of the semiconductor switch element connected between the first reference potential terminal and the second reference potential terminal. The second voltage detection unit detects, based on a voltage across the second resistive element when the semiconductor switch element and the second detecting switch element are both on, the on-state voltage of the semiconductor switch element connected between the first reference potential terminal and the second reference potential terminal.

An on-state voltage measurement circuit according to still another aspect of the present disclosure measures an on-state voltage of a semiconductor switch element including a first control terminal, a first main terminal corresponding to the first control terminal, a second control terminal, and a second main terminal corresponding to the second control terminal. The on-state voltage is a voltage between the first main terminal and the second main terminal of the semiconductor switch element in an on state. The on-state voltage measurement circuit includes a first detecting switch element, a first resistive element, a first voltage detection unit, a second detecting switch element, a second resistive element, and a second voltage detection unit. The first detecting switch element includes a first drain terminal, a first source terminal, and a first gate terminal and is a normally-on switch element. The first resistive element is connected between the first source terminal and the first gate terminal. The second detecting switch element includes a second drain terminal, a second source terminal, and a second gate terminal and is a normally-on switch element. The second resistive element is connected between the second source terminal and the second gate terminal. In the on-state voltage measurement circuit, the first drain terminal of the first detecting switch element and the second drain terminal of the second detecting switch element are connected to each other. A resistance value of the first resistive element is greater than an on-state resistance of the first detecting switch element. A resistance value of the second resistive element is greater than an on-state resistance of the second detecting switch element. The first voltage detection unit detects, based on a voltage across the first resistive element when the semiconductor switch element and the first detecting switch element are both on, the on-state voltage of the semiconductor switch element connected between the first gate terminal and the second gate terminal. The second voltage detection unit detects, based on a voltage across the second resistive element when the semiconductor switch element and the second detecting switch element are both on, the on-state voltage of the semiconductor switch element connected between the first gate terminal and the second gate terminal.

An on-state voltage measurement circuit according to yet another aspect of the present disclosure measures an on-state voltage of a semiconductor switch element including a first control terminal, a first main terminal corresponding to the first control terminal, a second control terminal, and a second main terminal corresponding to the second control terminal. The on-state voltage is a voltage between the first main terminal and the second main terminal of the semiconductor switch element in an on state. The on-state voltage measurement circuit includes a detecting switch element, a first control unit, a first resistive element, a first voltage detection unit, a second control unit, a second resistive element, and a second voltage detection unit. The detecting switch element includes a first gate terminal, a first source terminal corresponding to the first gate terminal, a second gate terminal, and a second source terminal corresponding to the second gate terminal. The first control unit includes a first signal output terminal and a first reference potential terminal and controls a first gate voltage at the first gate terminal of the detecting switch element. The first resistive element is connected between the first source terminal and the first reference potential terminal. The second control unit includes a second signal output terminal and a second reference potential terminal and controls a second gate voltage at the second gate terminal of the detecting switch element. The second resistive element is connected between the second source terminal and the second reference potential terminal. A resistance value of the first resistive element is greater than an on-state resistance of the detecting switch element. A resistance value of the second resistive element is greater than the on-state resistance of the detecting switch element. The first voltage detection unit detects, based on a voltage across the first resistive element when the semiconductor switch element and the detecting switch element are both on, the on-state voltage of the semiconductor switch element connected between the first reference potential terminal and the second reference potential terminal. The second voltage detection unit detects, based on a voltage across the second resistive element when the semiconductor switch element and the detecting switch element are both on, the on-state voltage of the semiconductor switch element connected between the first reference potential terminal and the second reference potential terminal.

An on-state voltage measurement circuit according to yet another aspect of the present disclosure measures an on-state voltage of a semiconductor switch element including a first control terminal, a first main terminal corresponding to the first control terminal, a second control terminal, and a second main terminal corresponding to the second control terminal. The on-state voltage is a voltage between the first main terminal and the second main terminal of the semiconductor switch element in an on state. The on-state voltage measurement circuit includes a first detecting switch element, a first control unit, a second detecting switch element, a second control unit, a resistive element, and a voltage detection unit. The first detecting switch element includes a first drain terminal, a first source terminal, and a first gate terminal. The first control unit includes a first signal output terminal and a first reference potential terminal and controls the first detecting switch element. The second detecting switch element includes a second drain terminal, a second source terminal, and a second gate terminal. The second control unit includes a second signal output terminal and a second reference potential terminal and controls the second detecting switch element. The resistive element is connected between the first source terminal of the first detecting switch element and the second source terminal of the second detecting switch element. The first signal output terminal of the first control unit is connected to the first gate terminal of the first detecting switch element. The first reference potential terminal of the first control unit is connected to the second source terminal of the second detecting switch element. The second signal output terminal of the second control unit is connected to the second gate terminal of the second detecting switch element. The second reference potential terminal of the second control unit is connected to the first source terminal of the first detecting switch element. A resistance value of the resistive element is greater than any one of an on-state resistance of the first detecting switch element or an on-state resistance of the second detecting switch element. The voltage detection unit detects, based on a voltage across the resistive element when the semiconductor switch element is on, the on-state voltage of the semiconductor switch element connected between the first reference potential terminal and the second reference potential terminal.

An on-state voltage measurement circuit according to yet another aspect of the present disclosure measures an on-state voltage of a semiconductor switch element including a first control terminal, a first main terminal corresponding to the first control terminal, a second control terminal, and a second main terminal corresponding to the second control terminal. The on-state voltage is a voltage between the first main terminal and the second main terminal of the semiconductor switch element in an on state. The on-state voltage measurement circuit includes a first detecting switch element, a second detecting switch element, a resistive element, and a voltage detection unit. The first detecting switch element includes a first drain terminal, a first source terminal, and a first gate terminal and is a normally-on switch element. The second detecting switch element includes a second drain terminal, a second source terminal, and a second gate terminal and is a normally-on switch element. The resistive element is connected between the first source terminal of the first detecting switch element and the second source terminal of the second detecting switch element. In the on-state voltage measurement circuit, the first source terminal of the first detecting switch element is connected to the second gate terminal of the second detecting switch element. The second source terminal of the second detecting switch element is connected to the first gate terminal of the first detecting switch element. A resistance value of the resistive element is greater than any one of an on-state resistance of the first detecting switch element or an on-state resistance of the second detecting switch element. The voltage detection unit detects, based on a voltage across the resistive element when the semiconductor switch element is on, the on-state voltage of the semiconductor switch element connected between the first source terminal and the second source terminal.

DESCRIPTION OF EMBODIMENTS

First Embodiment

Figure 1:
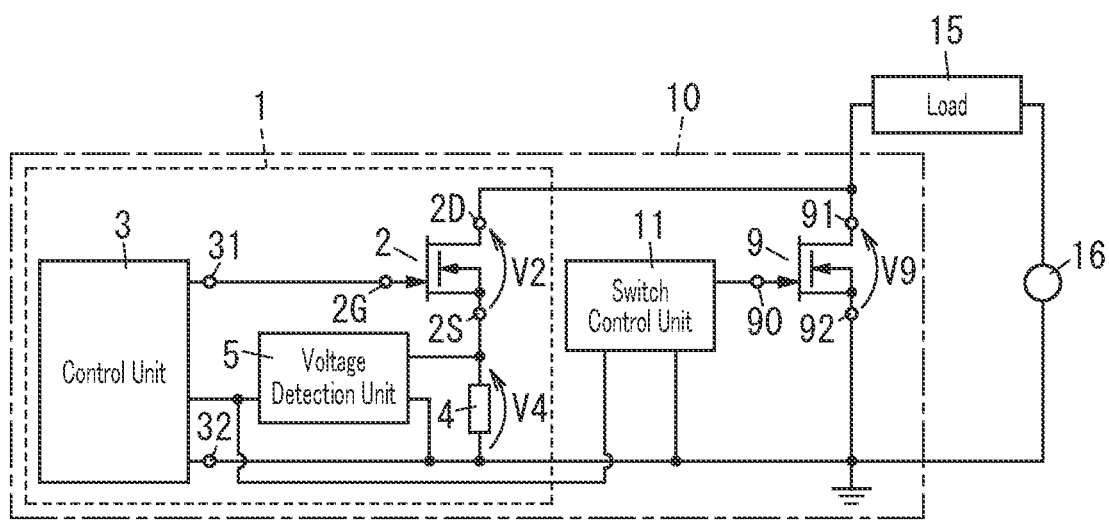
FIG. 1 is a circuit diagram of a switch system including an on-state voltage measurement circuit according to a first embodiment.

A switch system 10 including an on-state voltage measurement circuit 1 according to a first embodiment will now be described with reference to FIGS. 1-3.
(1) Overview As shown in FIG. 1, the switch system 10 includes not only the on-state voltage measurement circuit 1 but also a semiconductor switch element 9. The semiconductor switch element 9 includes a control terminal 90, a first main terminal 91, and a second main terminal 92. The on-state voltage measurement circuit 1 measures an on-state voltage of the semiconductor switch element 9. The on-state voltage of the semiconductor switch element 9 is a voltage between the first main terminal 91 and second main terminal 92 of the semiconductor switch element 9 in on state.

The on-state voltage measurement circuit 1 includes a detecting switch element 2, a control unit 3, a resistive element 4, and a voltage detection unit 5. The detecting switch element 2 includes a drain terminal 2D, a source terminal 2S, and a gate terminal 2G.

The switch system 10 further includes a switch control unit 11 for controlling the semiconductor switch element 9. In the switch system 10, a series circuit of a load 15 and a power supply 16, for example, may be connected between the first main terminal 91 and second main terminal 92 of the semiconductor switch element 9. Note that neither the load 15 nor the power supply 16 is a constituent element of the switch system 10.
(2) Respective Constituent Elements of Switch System
(2.1) Semiconductor Switch Element The semiconductor switch element 9 may be, for example, a normally-off junction field effect transistor (JFET). More specifically, the semiconductor switch element 9 may be a GaN-based gate injection transistor (GIT). In this case, the control terminal 90, first main terminal 91, and second main terminal 92 of the semiconductor switch element 9 are a gate terminal, a drain terminal, and a source terminal, respectively.

The GaN-based GIT includes, for example, a GIT chip and a package that houses the GIT chip therein. The GIT chip includes, for example, a substrate, a buffer layer, a first nitride semiconductor layer, a second nitride semiconductor layer, a source electrode, a gate electrode, a drain electrode, and a p-type layer. The buffer layer is formed on the substrate. The first nitride semiconductor layer is formed on the buffer layer. The second nitride semiconductor layer is formed on the first nitride semiconductor layer. The source electrode, the gate electrode, and the drain electrode are formed on the second nitride semiconductor layer. The p-type layer is interposed between the gate electrode and the second nitride semiconductor layer. The second nitride semiconductor layer forms a heterojunction portion along with the first nitride semiconductor layer. In the first nitride semiconductor layer, a two-dimensional electron gas has been generated in the vicinity of the heterojunction portion. A region including the two-dimensional electron gas (hereinafter referred to as a "two-dimensional electron gas layer") may also serve as an n-channel layer (electron conduction layer). In the GIT chip, a pin diode structure is formed by the p-type layer, the second nitride semiconductor layer, and the n-channel layer. The second nitride semiconductor layer and the p-type layer form a diode. The gate of the GIT chip includes the gate electrode and the p-type layer. The source of the GIT chip includes the source electrode. The drain of the GIT chip includes the drain electrode. The substrate may be a silicon substrate, for example. The buffer layer may be an undoped GaN layer, for example. The first nitride semiconductor layer may be, for example, an undoped GaN layer. The second nitride semiconductor layer may be, for example, an undoped AlGaN layer. The p-type layer may be, for example, a p-type AlGaN layer. Each of the buffer layer, the first nitride semiconductor layer, and the second nitride semiconductor layer may include impurities such as Mg, H, Si, C, and O to be inevitably contained during their growing process by metal-organic vapor phase epitaxy (MOVPE), for example. The package includes the control terminal 90, the first main terminal 91, and the second main terminal 92 that are connected to the gate electrode, the drain electrode, and the source electrode, respectively.

(2.2) Switch Control Unit

The switch control unit 11 outputs a control signal S9 (refer to FIG. 2) for controlling the semiconductor switch element 9. The control signal S9 is a voltage signal applied between the control terminal 90 and second main terminal 92 of the semiconductor switch element 9. To turn the semiconductor switch element 9 on, the switch control unit 11 outputs, as the control signal S9, a voltage signal (on signal), of which the voltage level is greater than a threshold voltage Vth9 (refer to FIG. 2) of the semiconductor switch element 9. On the other hand, to turn the semiconductor switch element 9 off, the switch control unit 11 outputs, as the control signal S9, a voltage signal (off signal), of which the voltage level is less than the threshold voltage Vth9 of the semiconductor switch element 9.

The switch control unit 11 may include, for example, a driver circuit for driving the semiconductor switch element 9 and a control circuit for controlling the driver circuit. However, this is only an example and should not be construed as limiting. Alternatively, the switch control unit 11 may also be a driver IC (integrated circuit), for example.

(2.3) On-State Voltage Measurement Circuit

The on-state voltage measurement circuit 1 includes the detecting switch element 2, the control unit 3, the resistive element 4, and the voltage detection unit 5. The detecting switch element 2 includes the drain terminal 2D, the source terminal 2S, and the gate terminal 2G. The control unit 3 includes a signal output terminal 31 and a reference potential terminal 32 and controls the detecting switch element 2. The resistive element 4 is connected between the source terminal 2S and the reference potential terminal 32. One end of the resistive element 4 is connected to the source terminal 2S and the other end of the resistive element 4 is connected to the reference potential terminal 32. The voltage detection unit 5 detects the on-state voltage of the semiconductor switch element 9.

The detecting switch element 2 is a normally-off switch element. In this embodiment, the detecting switch element 2, as well as the semiconductor switch element 9, may be a normally-off JFET. More specifically, the detecting switch element 2 is a GaN-based GIT.

The control unit 3 turns the detecting switch element 2 off when the semiconductor switch element 9 is off and turns the detecting switch element 2 on when the semiconductor switch element 9 is on. The voltage detection unit 5 detects, based on a voltage V4 across the resistive element 4 when the semiconductor switch element 9 and the detecting switch element 2 are both on, an on-state voltage of the semiconductor switch element 9 connected between the drain terminal 2D and the reference potential terminal 32.

In the control unit 3, the signal output terminal 31 thereof is connected to the gate terminal 2G of the detecting switch element 2. In addition, in the control unit 3, the reference potential terminal 32 thereof is connected to the source terminal 2S of the detecting switch element 2 via the resistive element 4. To turn the detecting switch element 2 on, the control unit 3 outputs, as the control signal S2 (refer to FIG. 2), an on signal that turns the detecting switch element 2 on. The on signal that turns the detecting switch element 2 on is a voltage signal having a voltage level (of 5 V, for example) that makes the gate voltage (i.e., the voltage between the gate terminal 2G and the source terminal 2S) of the detecting switch element 2 greater than the threshold voltage Vth2 of the detecting switch element 2. On the other hand, to turn the detecting switch element 2 off, the control unit 3 outputs, as the control signal S2, an off signal that turns the detecting switch element 2 off. The off signal that turns the detecting switch element 2 off is a voltage signal having a voltage level (of 0 V, for example) that makes the gate voltage (i.e., the voltage between the gate terminal 2G and the source terminal 2S) of the detecting switch element 2 less than the threshold voltage Vth2 of the detecting switch element 2.

In addition, the control unit 3 is also connected to the voltage detection unit 5. The control unit 3 controls the detecting switch element 2 based on the on-state voltage detected by the voltage detection unit 5. More specifically, when finding the on-state voltage detected by the voltage detection unit 5 equal to or greater than the threshold value Vt (refer to FIGS. 2 and 3), the control unit 3 turns the detecting switch element 2 off. In the switch system 10 including the on-state voltage measurement circuit 1, when finding the on-state voltage detected by the voltage detection unit 5 equal to or greater than the threshold value Vt, the switch control unit 11 turns the semiconductor switch element 9 off. The threshold value Vt is a voltage value which is set for detecting any abnormality in the operation of the semiconductor switch element 9 in the on state.

The control unit 3 may, but does not have to, include a driver circuit for supplying the control signal S2 to the detecting switch element 2 and a power supply connected to the driver circuit.

The control unit 3 includes a computer system. The computer system includes either a single computer or a plurality of computers. The computer system may include a processor and a memory as principal hardware components thereof. At least some functions of the control unit 3 according to the present disclosure may be performed by making the processor execute a program stored in the memory of the computer system. The program may be stored in advance in the memory of the computer system. Alternatively, the program may also be downloaded through a telecommunications line or be distributed after having been recorded in some non-transitory storage medium such as a memory card, an optical disc, or a hard disk drive (magnetic disk), any of which is readable for the computer system. The processor of the computer system may be made up of a single or a plurality of electronic circuits including a semiconductor integrated circuit (IC) or a large-scale integrated circuit (LSI). Those electronic circuits may be either integrated together on a single chip or distributed on multiple chips, whichever is appropriate. Those multiple chips may be aggregated together in a single device or distributed in multiple devices without limitation.

The resistance value of the resistive element 4 is greater than the on-state resistance Ron2 of the detecting switch element 2. For example, the resistance value of the resistive element 4 may be ten times as large as the on-state resistance Ron2 of the detecting switch element 2.

The voltage detection unit 5 is connected across the resistive element 4. The voltage detection unit 5 detects, based on the voltage V4 across the resistive element 4 when the semiconductor switch element 9 and the detecting switch element 2 are both on, the on-state voltage of the semiconductor switch element 9 connected between the drain terminal 2D and the reference potential terminal 32.

The voltage output to the voltage detection unit 5 (i.e., the voltage V4 across the resistive element 4) is given by:

$$V4 = \{R4/(Ron2 + R4)\} \times Von9$$

where Von9 is the on-state voltage of the semiconductor switch element 9, R4 is the resistance value of the resistive element 4, and Ron2 is the on-state resistance of the detecting switch element 2.

The on-state resistance of the detecting switch element 2 is a resistance value between the drain terminal 2D and source terminal 2S of the detecting switch element 2 in the on state. The on-state resistance of the detecting switch element 2 varies depending on the temperature and gate voltage of the detecting switch element 2. Thus, to reduce the effect of the on-state resistance of the detecting switch element 2 on the voltage V4 across the resistive element 4 to N (%) or less, the resistance value R4 of the resistive element 4 satisfies:

$$R4 \geq \{(100 - N)/N\} \times Ron2.$$

Therefore, to reduce N to 10% or less, it is preferable that the resistance value of the resistive element 4 be at least nine times as large as the on-state resistance Ron2 of the detecting switch element 2.

The voltage detection unit 5 also has the capability of determining the condition of the semiconductor switch element 9 based on the on-state voltage detected. For example, when comparing the on-state voltage detected with a threshold value Vt to find the on-state voltage less than the threshold value Vt, the voltage detection unit 5 decides that there be no abnormality in the operation of the semiconductor switch element 9. On the other hand, when finding the on-state voltage equal to or greater than the threshold value, the voltage detection unit 5 decides that there be some abnormality in the operation of the semiconductor switch element 9. As used herein, if "there is no abnormality," it means that no abnormal current is flowing through the semiconductor switch element 9. On the other hand, if "there is any abnormality," it means that an abnormal current is flowing through the semiconductor switch element 9 to make the voltage V9 greater than the voltage V9 of the semiconductor switch element 9 in the on state, through which no abnormal current is flowing. The voltage detection unit 5 may include, for example, a comparator for comparing the on-state voltage with the threshold value Vt. In that case, the voltage detection unit 5 is configured to receive the threshold value Vt at an inverting input terminal of the comparator and receive, at a non-inverting input terminal of the comparator, the on-state voltage detected by the voltage detection unit 5 (i.e., the voltage V4 across the resistive element 4). In the voltage detection unit 5, if the voltage V4 is equal to or greater than the threshold value Vt, the output signal of the comparator comes to have an H level. If the voltage V4 is less than the threshold value Vt, then the output signal of the comparator comes to have an L level. In the voltage detection unit 5, the output signal of the comparator having the H level means that a decision has been made that an abnormal current be flowing through the semiconductor switch element 9 (i.e., there be some abnormality in the operation of the semiconductor switch element 9). On the other hand, the output signal of the comparator having the L level means that a decision has been made that no abnormal current be flowing through the semiconductor switch element 9 (i.e., there be no abnormality in the operation of the semiconductor switch element 9). In the on-state voltage measurement circuit 1, the output terminal of the voltage detection unit 5 is connected to the control unit 3 so that the decision made by the voltage detection unit 5 is provided for the control unit 3. Also, in the switch system 10, the output terminal of the voltage detection unit 5 is connected to the switch control unit 11 so that the decision made by the voltage detection unit 5 is provided for the switch control unit 11.

(3) Operation of Switch System

Figure 2:
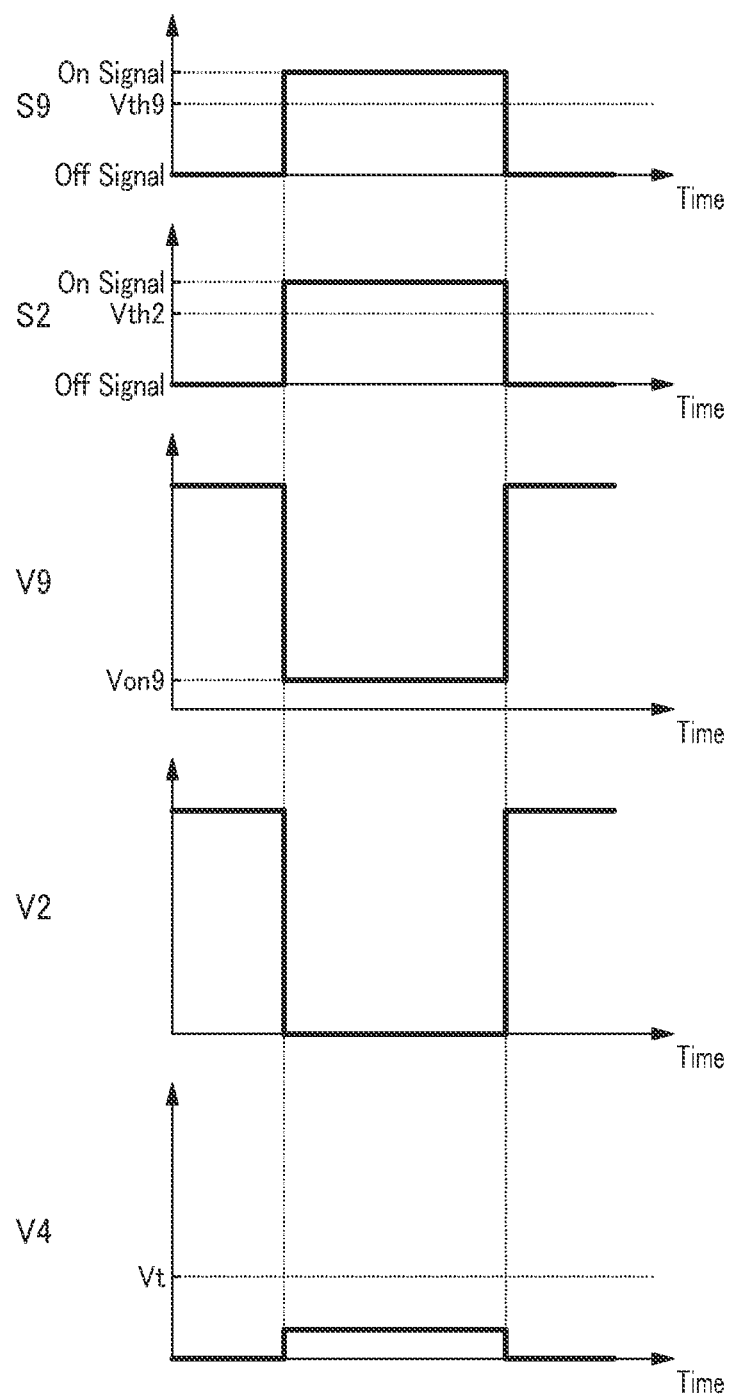
FIG. 2 shows operating waveforms of the switch system including the on-state voltage measurement circuit.
Figure 3:
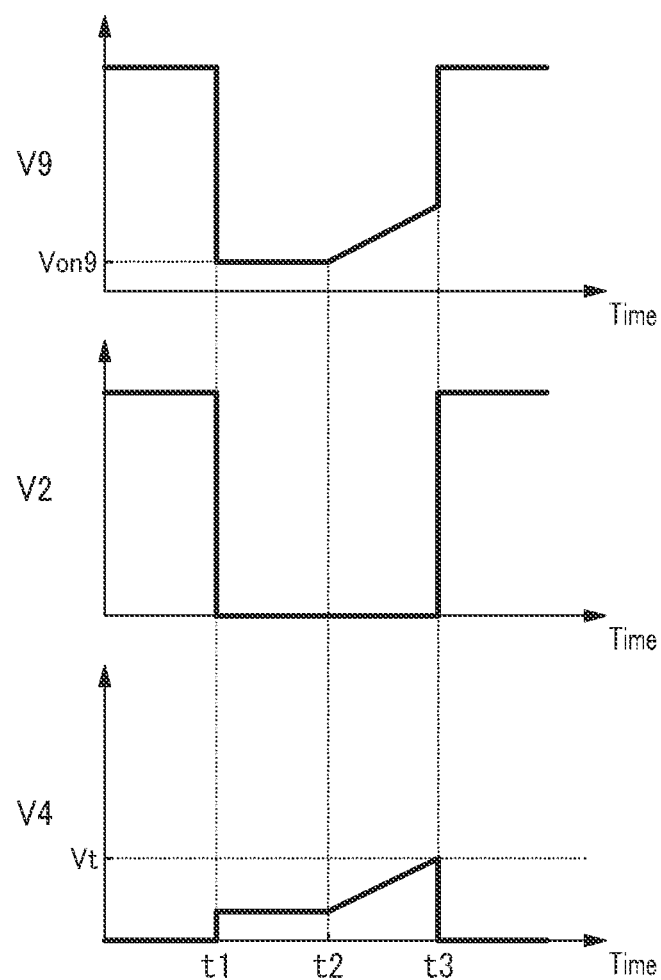
FIG. 3 shows operating waveforms of the switch system including the on-state voltage measurement circuit.

FIG. 2 shows exemplary operating waveforms of the switch system 10 in a situation where there is no abnormality in the operation of the semiconductor switch element 9. FIG. 3 shows exemplary operating waveforms of the switch system 10 in a situation where the semiconductor switch element 9 causes some abnormality while the switch system 10 is operating.

In FIG. 2, S9 denotes a control signal supplied from the switch control unit 11 to the semiconductor switch element 9. In FIG. 2, S2 denotes a control signal supplied from the control unit 3 to the detecting switch element 2. In FIGS. 1-3, V9 denotes a voltage between the first main terminal (drain terminal) 91 and second main terminal (source terminal) 92 of the semiconductor switch element 9. Also, in FIGS. 1-3, V2 denotes the voltage between the drain terminal 2D and source terminal 2S of the detecting switch element 2. Furthermore, in FIGS. 1-3, V4 is the voltage across the resistive element 4.

(3.1) Exemplary Operation when there is No Abnormality of Semiconductor Switch Element An exemplary operation of the switch system 10 in a situation where there is no abnormality in the operation of the semiconductor switch element 9 will be described with reference to FIG. 2.

In the switch system 10, while the semiconductor switch element 9 is off state with an off signal supplied to the semiconductor switch element 9, the voltage V9 at the semiconductor switch element 9 becomes the voltage across a series circuit of the power supply 16 and the load 15. Also, in the switch system 10, while the semiconductor switch element 9 is in the off state and the detecting switch element 2 is also in the off state with an off signal supplied to the detecting switch element 2, the voltage V2 at the detecting switch element 2 comes to have substantially the same voltage value as the voltage V9. Furthermore, in the switch system 10, while the semiconductor switch element 9 is in the off state and the detecting switch element 2 is in the off state, no current flows through the resistive element 4, and therefore, the voltage V4 will be 0 V.

In the switch system 10, while the semiconductor switch element 9 is on state with an on signal supplied to the semiconductor switch element 9, the voltage V9 at the semiconductor switch element 9 becomes the on-state voltage Von9 of the semiconductor switch element 9. Also, in the switch system 10, while the semiconductor switch element 9 is in the off state and the detecting switch element 2 is also in on state with an on signal supplied to the detecting switch element 2, the voltage V2 at the detecting switch element 2 will be an on-state voltage Von2 of the detecting switch element 2. Furthermore, in the switch system 10, while the semiconductor switch element 9 is in on state and the detecting switch element 2 is in on state, a current flows through the resistive element 4, and therefore, the voltage V4 comes to have a voltage value determined by the resistance value of the resistive element 4 and the current value of a current flowing through the resistive element 4. This voltage value is smaller than the threshold value Vt described above.

(3.2) Operation when Semiconductor Switch Element Causes Some Abnormality During Operation An exemplary operation of the switch system 10 in a situation where the semiconductor switch element 9 causes some abnormality while the switch system 10 is operating will be described with reference to FIG. 3.

In the switch system 10, if the semiconductor switch element 9 causes any abnormality to cause an increase in the current flowing through the semiconductor switch element 9 and an increase in the voltage V9 at the semiconductor switch element 9 while the semiconductor switch element 9 is in on state and the detecting switch element 2 is also in on state, the current flowing through the resistive element 4 also increases to cause an increase in the voltage V4 at the resistive element 4. In the switch system 10, when the on-state voltage (voltage V4) detected by the voltage detection unit 5 becomes equal to or greater than the threshold value Vt, the switch control unit 11 turns the semiconductor switch element 9 off and the control unit 3 turns the detecting switch element 2 off. This allows the switch system 10 to cut off, when an abnormal current flows through the semiconductor switch element 9, the abnormal current flowing through the semiconductor switch element 9.

(4) Advantages

An on-state voltage measurement circuit 1 according to the first embodiment includes a series circuit of a detecting switch element 2 and a resistive element 4, of which the resistance value is greater than an on-state resistance of the detecting switch element 2. The on-state voltage measurement circuit 1 uses this series circuit which is connected in parallel to the semiconductor switch element 9, of which the on-state voltage needs to be measured. In the on-state voltage measurement circuit 1 according to the first embodiment, the voltage detection unit 5 detects, based on the voltage V4 across the resistive element 4 when the semiconductor switch element 9 and the detecting switch element 2 are both on, the on-state voltage of the semiconductor switch element 9 connected between the drain terminal 2D and the reference potential terminal 32. In the on-state voltage measurement circuit 1 according to the first embodiment, most of the on-state voltage of the semiconductor switch element 9 is applied to the resistive element 4, thus contributing to improving the measurement accuracy of the on-state voltage.

In addition, the on-state voltage measurement circuit 1 according to the first embodiment may detect an abnormality that an abnormal current is flowing through the semiconductor switch element 9 by making the voltage detection unit 5 compare the on-state voltage detected with the threshold value Vt.

Variation of First Embodiment

Figure 4:
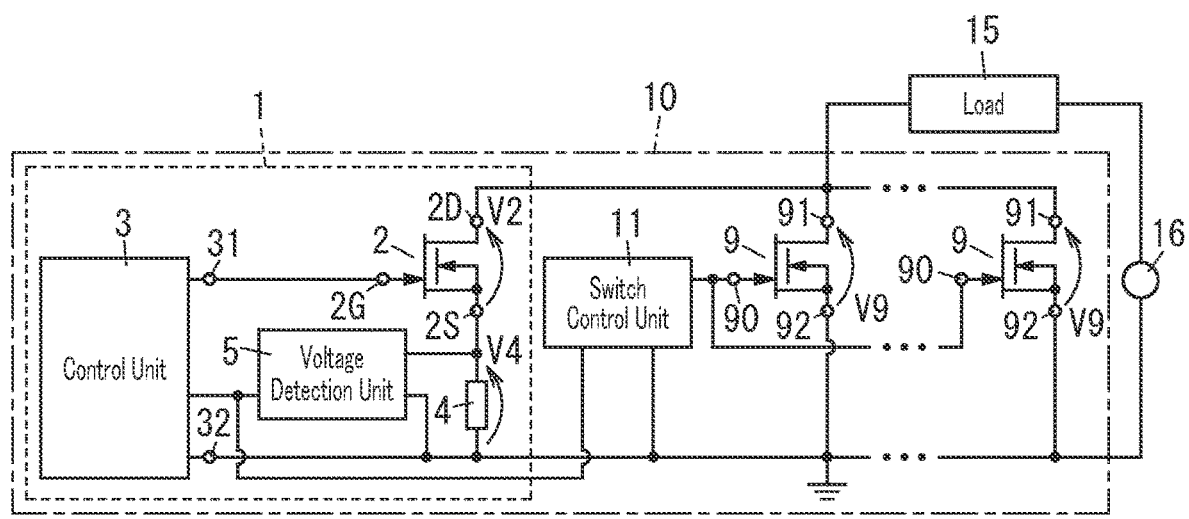
FIG. 4 is a circuit diagram illustrating a variation of the switch system including the on-state voltage measurement circuit.

Next, a switch system 10 according to a variation of the first embodiment will be described with reference to FIG. 4.

The switch system 10 according to this variation of the first embodiment has substantially the same circuit configuration as the switch system 10 according to the first embodiment shown in FIG. 1. In the following description, any constituent element of the switch system 10 according to this variation, having the same function as a counterpart of the switch system 10 according to the first embodiment described above, will be designated by the same reference numeral as that counterpart's, and description thereof will be omitted herein.

The switch system 10 according to this variation of the first embodiment includes a plurality of semiconductor switch elements 9. The plurality of semiconductor switch elements 9 are connected in parallel. In the on-state voltage measurement circuit 1, a series circuit of the detecting switch element 2 and the resistive element 4 is connected to a parallel circuit of the plurality of semiconductor switch elements 9. Thus, the on-state voltage measurement circuit 1 measures the on-state voltage of the plurality of semiconductor switch elements 9 that are connected in parallel. This allows the on-state voltage measurement circuit 1 to measure the on-state voltage, which will be the same voltage value in the plurality of semiconductor switch elements 9 that are connected in parallel.

Second Embodiment

Figure 5:
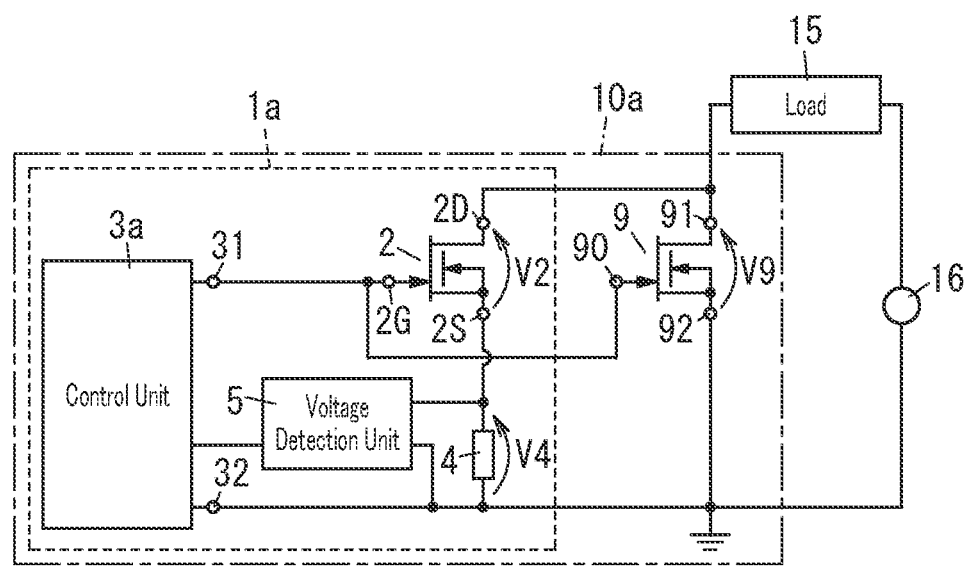
FIG. 5 is a circuit diagram of a switch system including an on-state voltage measurement circuit according to a second embodiment.

A switch system 10a including an on-state voltage measurement circuit 1a according to a second embodiment will now be described with reference to FIG. 5. In the following description, any constituent element of the on-state voltage measurement circuit 1a and switch system 10a according to this second embodiment, having the same function as a counterpart of the on-state voltage measurement circuit 1 and switch system 10 according to the first embodiment described above, will be designated by the same reference numeral as that counterpart's, and description thereof will be omitted herein as appropriate.

The switch system 10a includes the on-state voltage measurement circuit 1a instead of the on-state voltage measurement circuit 1 of the switch system 10.

The on-state voltage measurement circuit 1a according to the second embodiment includes a control unit 3a instead of the control unit 3 of the on-state voltage measurement circuit 1 according to the first embodiment. The control unit 3a, as well as the control unit 3, includes the signal output terminal 31 and the reference potential terminal 32. The control unit 3a controls not only the detecting switch element 2 as in the on-state voltage measurement circuit 1 according to the first embodiment, but also the semiconductor switch element 9 as well. That is to say, the control unit 3a also performs the function of the switch control unit 11 in the switch system 10 including the on-state voltage measurement circuit 1 according to the first embodiment. The control unit 3a is connected to both the detecting switch element 2 and the semiconductor switch element 9. More specifically, the signal output terminal 31 of the control unit 3a is connected to the gate terminal 2G of the detecting switch element 2 and the control terminal (gate terminal) 90 of the semiconductor switch element 9. Meanwhile, the reference potential terminal 32 of the control unit 3a is connected to the source terminal 2S of the detecting switch element 2 via the resistive element 4. The reference potential terminal 32 is also connected to the second main terminal 92 of the semiconductor switch element 9. The switch system 10a including the on-state voltage measurement circuit 1a does not include the switch control unit 11 of the switch system 10 including the on-state voltage measurement circuit 1 according to the first embodiment.

The on-state voltage measurement circuit 1a according to the second embodiment makes it easier to perform the control of turning the detecting switch element 2 on or off in synch with the timing when the semiconductor switch element 9 is turned on or off. In addition, the switch system 10a including the on-state voltage measurement circuit 1a according to the second embodiment may reduce the number of parts required, compared to the switch system 10 including the on-state voltage measurement circuit 1 according to the first embodiment.

Third Embodiment

Figure 6:
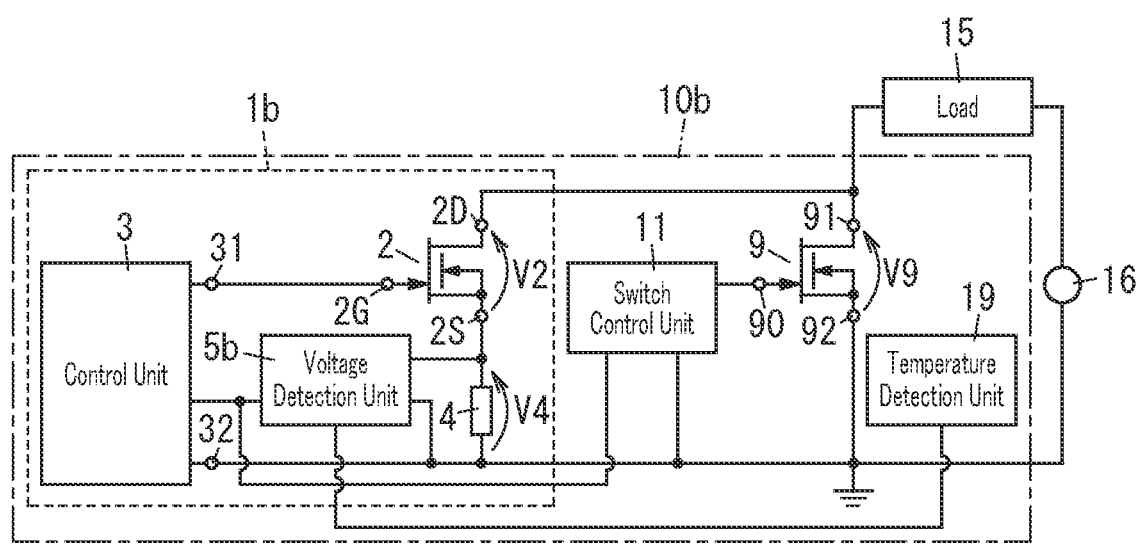
FIG. 6 is a circuit diagram of a switch system including an on-state voltage measurement circuit according to a third embodiment.

A switch system 10b including an on-state voltage measurement circuit 1b according to a third embodiment will now be described with reference to FIG. 6. In the following description, any constituent element of the on-state voltage measurement circuit 1b and switch system 10b according to this third embodiment, having the same function as a counterpart of the on-state voltage measurement circuit 1 and switch system 10 according to the first embodiment described above, will be designated by the same reference numeral as that counterpart's, and description thereof will be omitted herein as appropriate.

The on-state voltage measurement circuit 1b according to the third embodiment includes a voltage detection unit 5b instead of the voltage detection unit 5 of the on-state voltage measurement circuit 1 according to the first embodiment. In addition, the switch system 10b including the on-state voltage measurement circuit 1b according to the third embodiment further includes a temperature detection unit 19. The temperature detection unit 19 detects the temperature of the semiconductor switch element 9. The temperature detection unit 19 may be a thermistor, for example. The temperature detection unit 19 does not have to be a thermistor but may also be a diode, for example.

The on-state resistance of the semiconductor switch element 9 may increase as the temperature of the semiconductor switch element 9 rises. If the semiconductor switch element 9 has a different on-state resistance, then the current actually flowing through the semiconductor switch element 9 tends to have a different current value, even when the on-state voltage thereof is the same. In the semiconductor switch element 9, the higher the on-state resistance thereof is, the smaller the current value of the current flowing through the semiconductor switch element 9 tends to be.

The voltage detection unit 5b corrects, according to the temperature detected by the temperature detection unit 19, the threshold value Vt to be compared with the on-state voltage detected. In this case, the higher the detected temperature is, the higher the voltage value of the threshold value Vt corrected by the voltage detection unit 5b is.

The on-state voltage measurement circuit 1b according to the third embodiment allows the voltage detection unit 5b to correct the detected on-state voltage according to a variation in the temperature of the semiconductor switch element 9. Thus, the switch system 10b including the on-state voltage measurement circuit 1b may reduce a dispersion in cut off current value when the current flowing through the semiconductor switch element 9 is cut off in a situation where an abnormal current flows through the semiconductor switch element 9.

Fourth Embodiment

Figure 7:
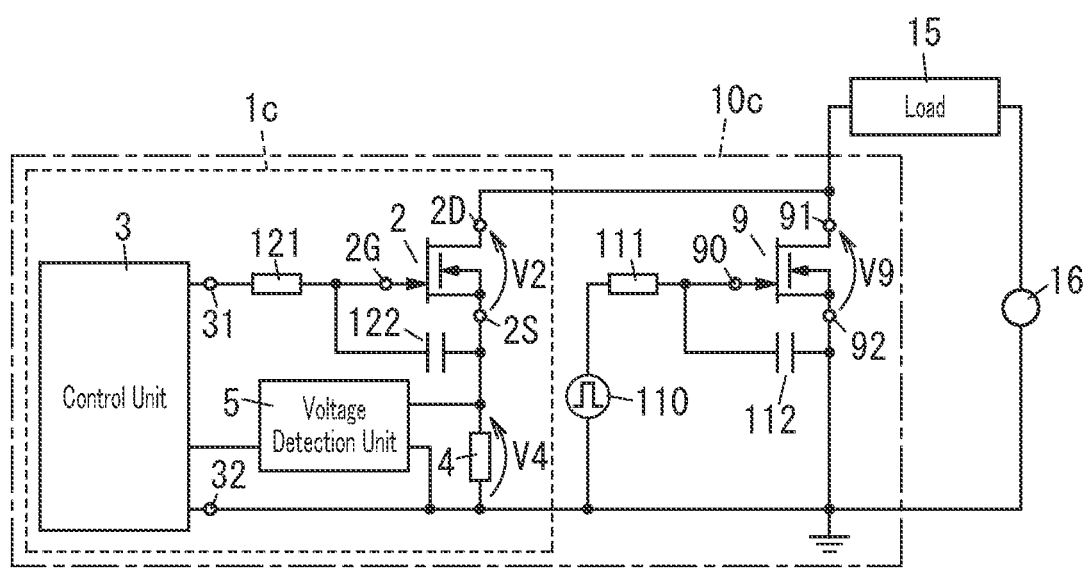
FIG. 7 is a circuit diagram of a switch system including an on-state voltage measurement circuit according to a fourth embodiment.
Figure 8:
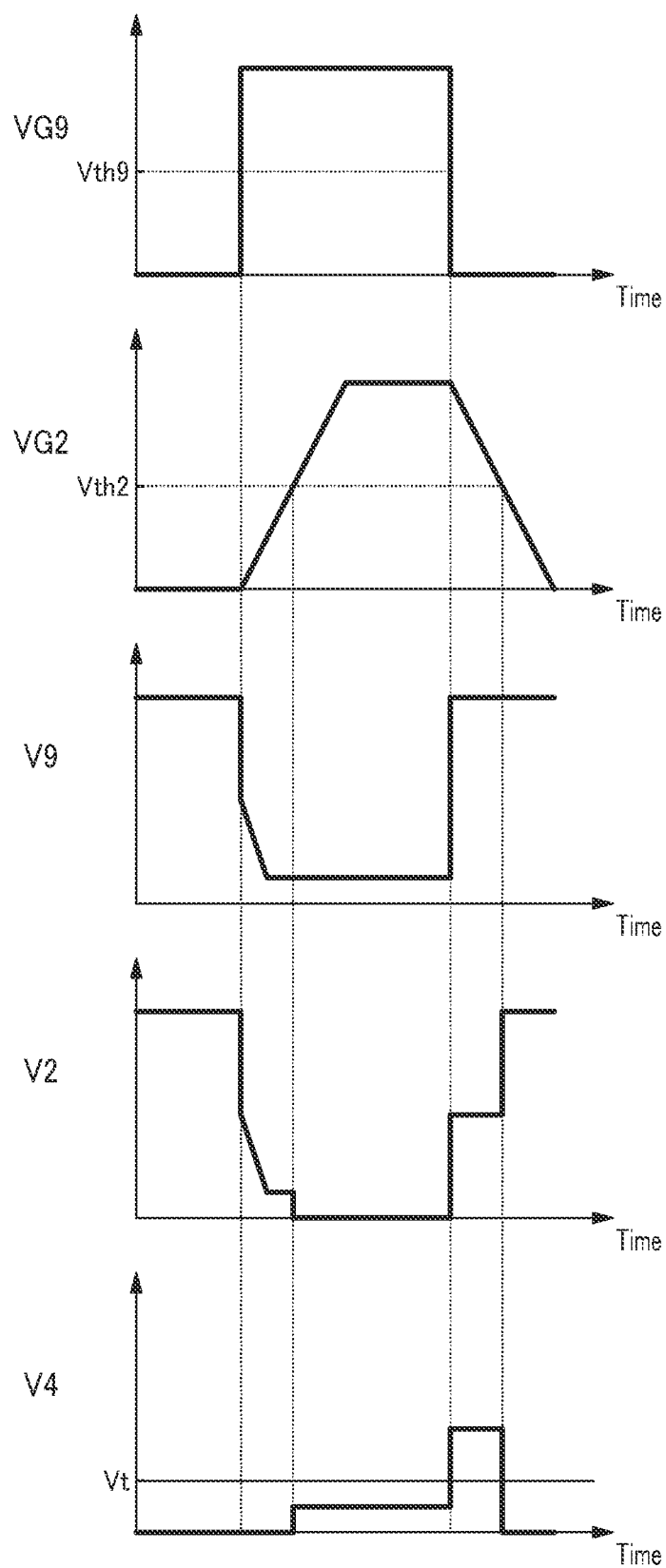
FIG. 8 is a timing chart showing how the switch system including the on-state voltage measurement circuit operates.

A switch system 10c including an on-state voltage measurement circuit 1c according to a fourth embodiment will now be described with reference to FIGS. 7 and 8. In the following description, any constituent element of the on-state voltage measurement circuit 1c and switch system 10c according to this fourth embodiment, having the same function as a counterpart of the on-state voltage measurement circuit 1 and switch system 10 according to the first embodiment described above, will be designated by the same reference numeral as that counterpart's, and description thereof will be omitted herein as appropriate. FIG. 8 shows exemplary operating waveforms of the switch system 10c in a situation where there is no abnormality in the operation of the semiconductor switch element 9. Each of the waveforms shown in FIG. 8 may be interpreted in the same way as in FIG. 2.

In the on-state voltage measurement circuit 1c, the control unit 3 turns the detecting switch element 2 on after the semiconductor switch element 9 has turned on.

The on-state voltage measurement circuit 1c further includes a gate resistor 121 and a gate capacitor 122. The gate resistor 121 is connected between the signal output terminal 31 of the control unit 3 and the gate terminal 2G of the detecting switch element 2. The gate capacitor 122 is connected between the gate terminal 2G and source terminal 2S of the detecting switch element 2. The switch system 10c includes a driver 110 instead of the switch control unit 11 and further includes a resistor 111 and a capacitor 112. In the semiconductor switch element 9, the control terminal 90 thereof is connected to the driver 110 via the resistor 111, and the capacitor 112 is connected between the control terminal 90 and the second main terminal 92 thereof. In the on-state voltage measurement circuit 1c, a time constant determined by the (resistance value of the) gate resistor 121 and the (capacitance of the) gate capacitor 122 is greater than a time constant determined by the (resistance value of the) resistor 111 and the (capacitance of the) capacitor 112. Thus, the on-state voltage measurement circuit 1c may make a first timing when the voltage VG9 at the control terminal 90 of the semiconductor switch element 9 reaches the threshold voltage Vth9 and a second timing when the voltage VG2 at the gate terminal 2G of the detecting switch element 2 reaches the threshold voltage Vth2 different from each other as shown in FIG. 8. The second timing is later than the first timing. Note that the on-state voltage measurement circuit 1c may include a control circuit for controlling the control unit 3 and the driver 110. Alternatively, the control unit 3 may be configured to operate in accordance with the operating information about the driver 110.

Figure 9:
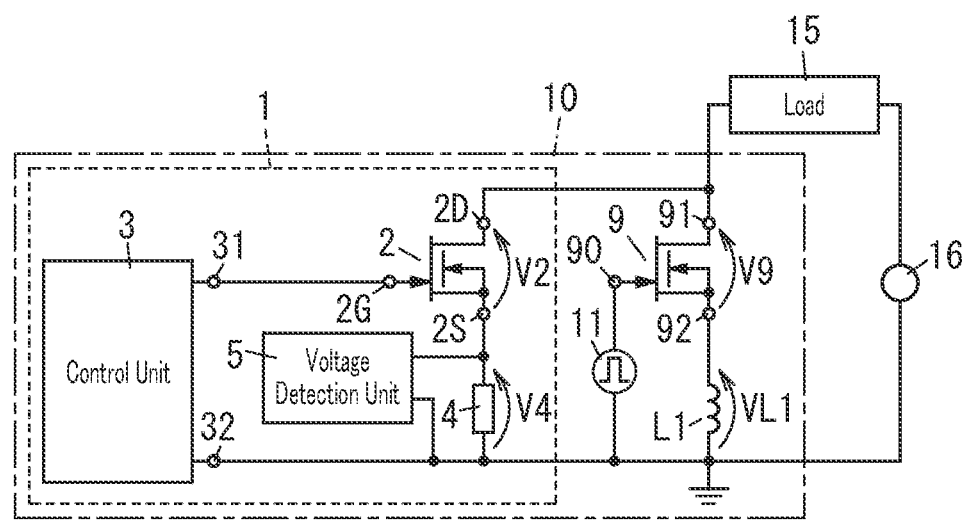
FIG. 9 is an equivalent circuit diagram illustrating a switch system, including the on-state voltage measurement circuit according to the first embodiment, to show how a switch system is affected by parasitic inductance.
Figure 10:
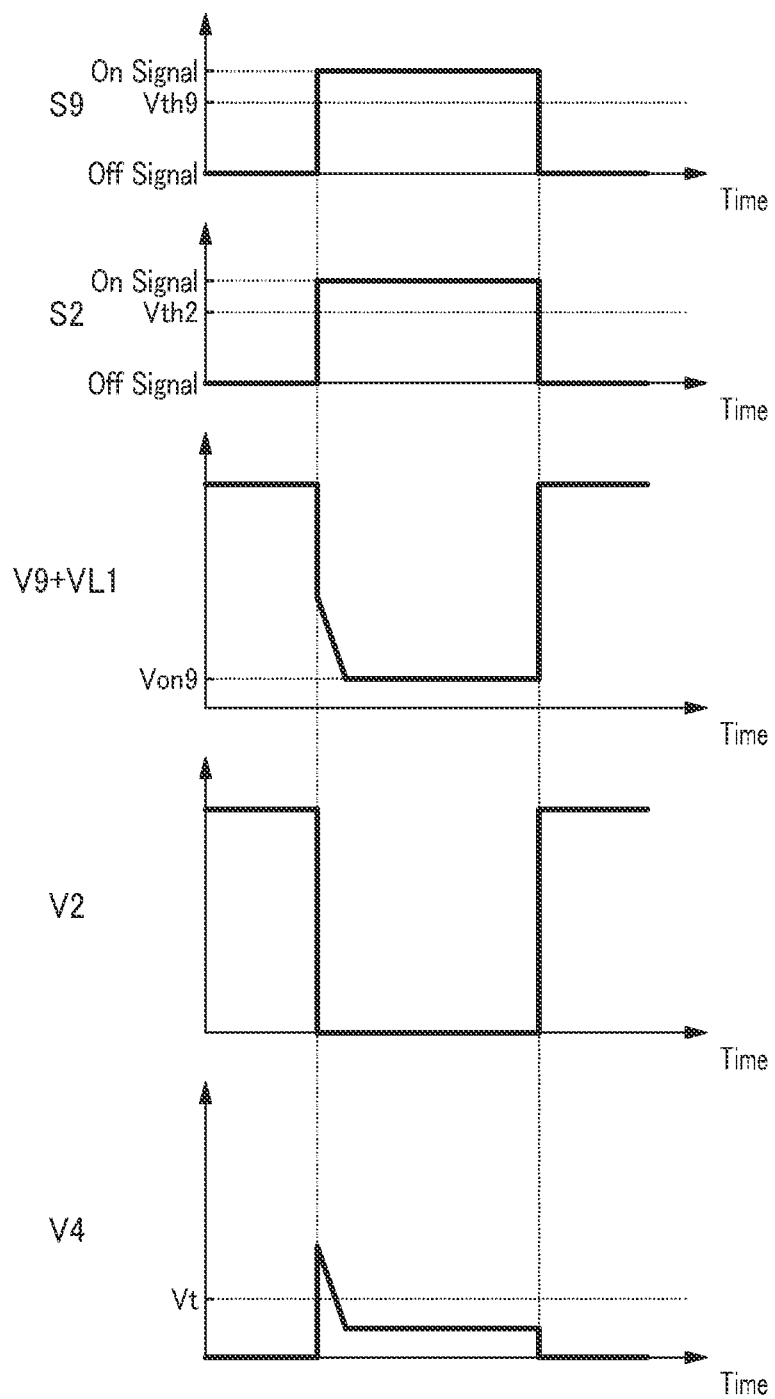
FIG. 10 shows operating waveforms for the equivalent circuit.

In the on-state voltage measurement circuit 1 according to the first embodiment (refer to FIG. 1), the voltage V4 across the resistive element 4 may be easily affected by the parasitic inductance of a line connected to the second main terminal 92 of the semiconductor switch element 9. More specifically, in the on-state voltage measurement circuit 1 according to the first embodiment, immediately after the semiconductor switch element 9 has turned on, electromotive force, generated due to the presence of the parasitic inductance and a current variation rate of the current flowing through the semiconductor switch element 9, tends to increase, and the voltage V4 tends to increase as well. FIG. 9 illustrates an equivalent circuit of a switch system 10 including an on-state voltage measurement circuit 1 with a parasitic inductor L1 having parasitic inductance. FIG. 10 is a waveform diagram showing an exemplary operation of the switch system 10, of which the equivalent circuit is shown in FIG. 9. FIG. 10 shows exemplary operating waveforms of the switch system 10 in a situation where there is no abnormality in the operation of the semiconductor switch element 9. Each of the waveforms shown in FIG. 10 may be interpreted in the same way as in FIG. 2. In FIGS. 9 and 10, VL1 denotes the electromotive force of the parasitic inductor L1. As can be seen from FIG. 10, immediately after the semiconductor switch element 9 has turned on, V9+VL1 may have a larger voltage value than the on-state voltage Von9 and the voltage V4 across the resistive element 4 may be greater than the threshold value Vt.

In contrast, in the on-state voltage measurement circuit 1c according to the fourth embodiment, no voltage is applied to the resistive element 4 for a predetermined period of time T1 since the semiconductor switch element 9 has turned on, thus improving the measurement accuracy of the on-state voltage to be detected by the voltage detection unit 5. More specifically, in the on-state voltage measurement circuit 1c according to the fourth embodiment, the on-state voltage detected by the voltage detection unit 5 while no abnormal current is flowing through the semiconductor switch element 9 is less likely to be affected by the electromotive force generated due to the presence of the parasitic inductor L1. This allows the on-state voltage measurement circuit 1c according to the fourth embodiment may reduce the chances of the on-state voltage detected by the voltage detection unit 5 while no abnormal current is flowing through the semiconductor switch element 9 being equal to or greater than the threshold value Vt. The predetermined period of time T1 corresponds to the time lag between the first timing and the second timing.

In the on-state voltage measurement circuit 1c, to turn the detecting switch element 2 on after the semiconductor switch element 9 has turned on, the time constant determined by the gate resistor 121 and the gate capacitor 122 is made larger than the time constant determined by the resistor 111 and the capacitor 112. However, this is only an example and should not be construed as limiting. Alternatively, the on-state voltage measurement circuit 1c may also be configured to, for example, turn the detecting switch element 2 on after the semiconductor switch element 9 has turned on by setting the threshold voltage Vth2 of the detecting switch element 2 at a value larger than the threshold voltage Vth9 of the semiconductor switch element 9.

Figure 11:
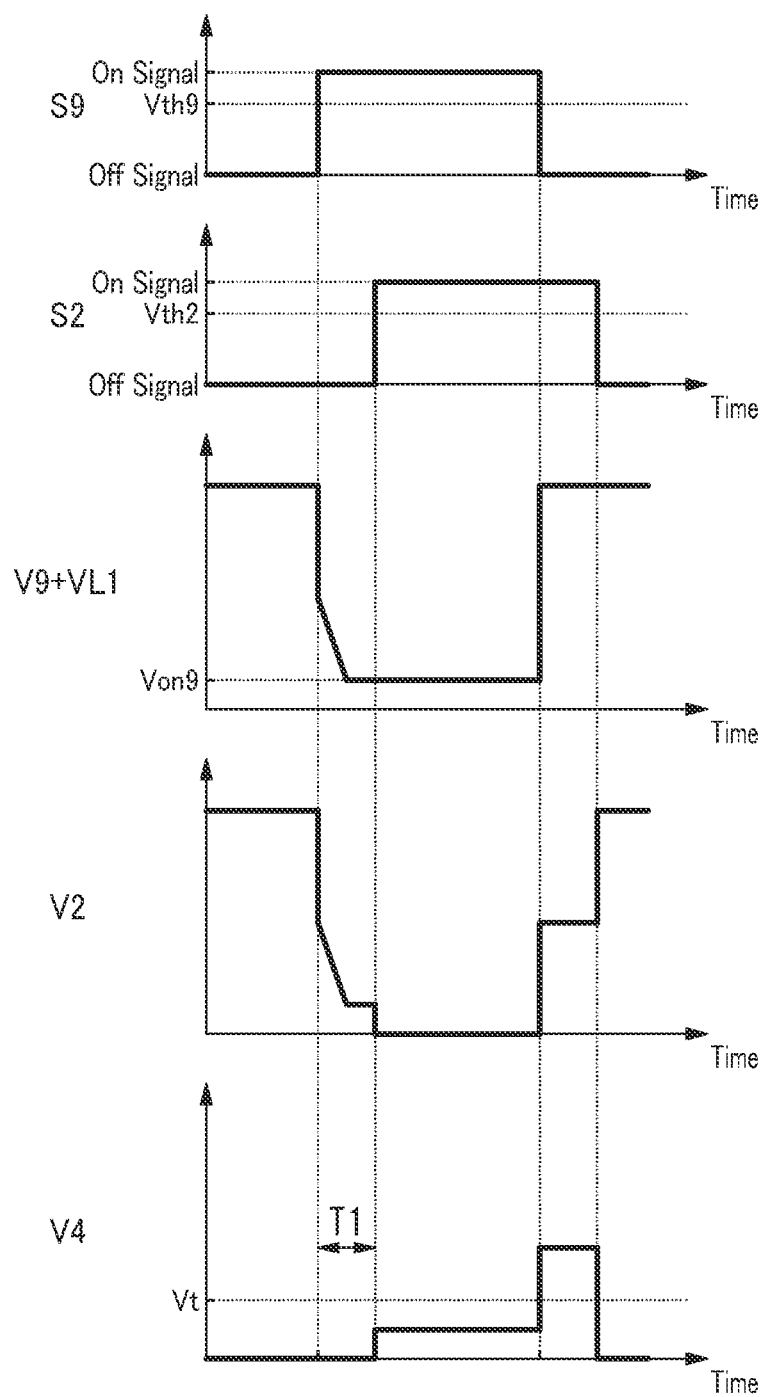
FIG. 11 is a timing chart showing how a switch system including the on-state voltage measurement circuit according to the fourth embodiment may also operate.

Still alternatively, the on-state voltage measurement circuit 1c may also be made to operate in the same way by making (the rising edge of the on signal of) the control signal S2 lag behind (the rising edge of the on signal of) the control signal S9 as shown in FIG. 11.

Fifth Embodiment

Figure 12:
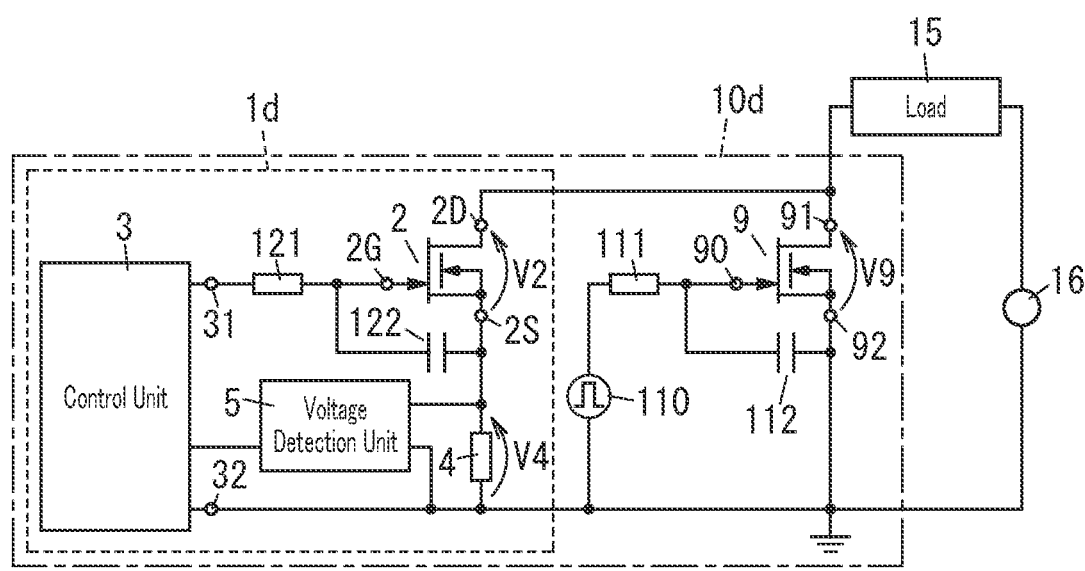
FIG. 12 is a circuit diagram of a switch system including an on-state voltage measurement circuit according to a fifth embodiment.
Figure 13:
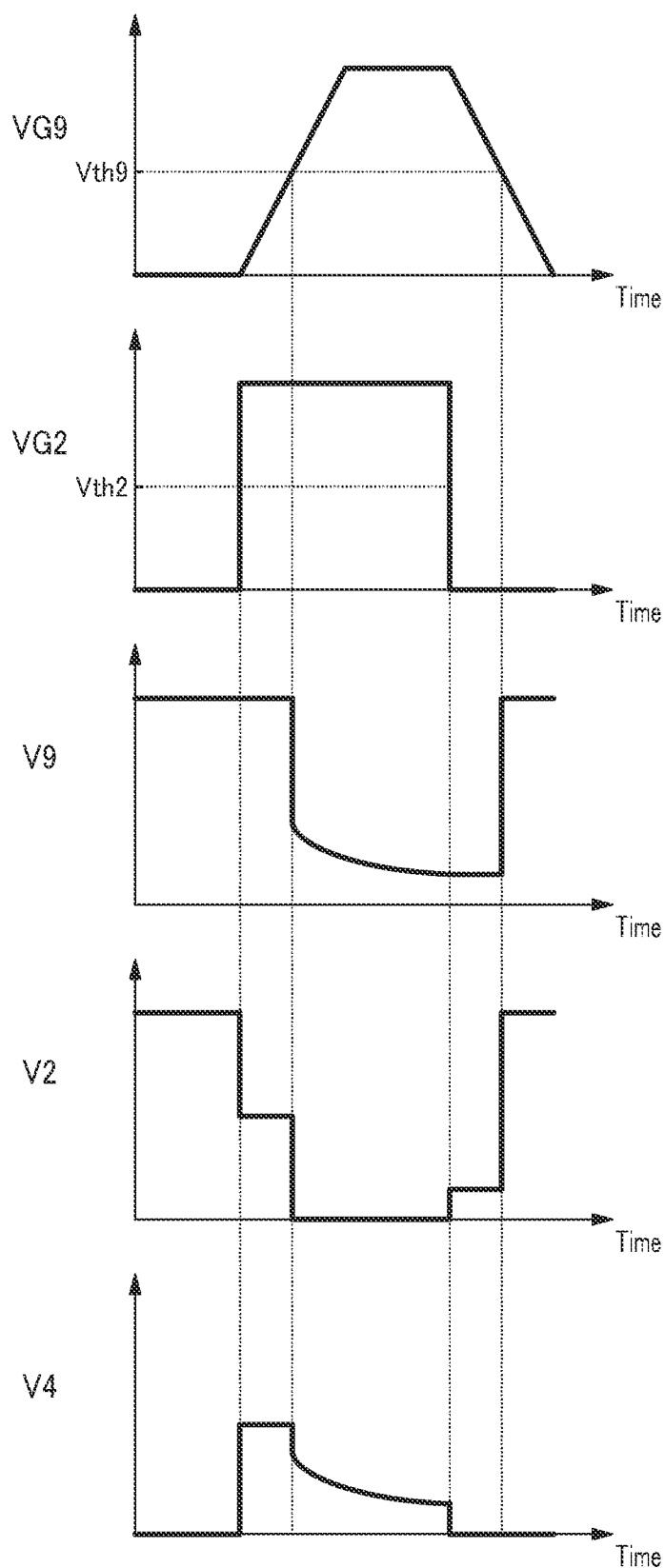
FIG. 13 is a timing chart showing how the switch system including the on-state voltage measurement circuit operates.

A switch system 10d including an on-state voltage measurement circuit 1d according to a fifth embodiment will now be described with reference to FIGS. 12 and 13. In the following description, any constituent element of the on-state voltage measurement circuit 1d and switch system 10d according to this fifth embodiment, having the same function as a counterpart of the on-state voltage measurement circuit 1 and switch system 10 according to the first embodiment described above, will be designated by the same reference numeral as that counterpart's, and description thereof will be omitted herein as appropriate. FIG. 13 shows exemplary operating waveforms of the switch system 10d in a situation where there is no abnormality in the operation of the semiconductor switch element 9. Each of the waveforms shown in FIG. 13 may be interpreted in the same way as in FIG. 2.

The on-state voltage measurement circuit 1d turns the detecting switch element 2 on before the semiconductor switch element 9 is turned on.

The on-state voltage measurement circuit 1d further includes a gate resistor 121 and a gate capacitor 122. The gate resistor 121 is connected between the signal output terminal 31 and the gate terminal 2G of the detecting switch element 2. The gate capacitor 122 is connected between the gate terminal 2G and source terminal 2S of the detecting switch element 2. In the semiconductor switch element 9, the control terminal 90 thereof is connected to the driver 110 via the resistor 111, and the capacitor 112 is connected between the control terminal 90 and the second main terminal 92 thereof. In the on-state voltage measurement circuit 1d, a time constant determined by the (resistance value of the) gate resistor 121 and the (capacitance of the) gate capacitor 122 is less than a time constant determined by the (resistance value of the) resistor 111 and the (capacitance of the) capacitor 112.

The on-state voltage measurement circuit 1d turns the detecting switch element 2 on before the semiconductor switch element 9 is turned on. This allows the on-state voltage measurement circuit 1d to detect, in response to occurrence of a current collapse phenomenon that the on-state resistance increases when the semiconductor switch element 9 is in on state, a variation in the on-state voltage of the semiconductor switch element 9 with time due to the effect of the current collapse phenomenon.

To turn the detecting switch element 2 on before the semiconductor switch element 9 is turned on, the on-state voltage measurement circuit 1d makes the time constant determined by the gate resistor 121 and the gate capacitor 122 less than the time constant determined by the resistor 111 and the capacitor 112. However, this is only an example and should not be construed as limiting. Alternatively, the on-state voltage measurement circuit 1*d* may also be configured to turn, before the semiconductor switch element 9 is turned on, the detecting switch element 2 on by setting the threshold voltage Vth2 of the detecting switch element 2 at a value smaller than the threshold voltage Vth9 of the semiconductor switch element 9.

Figure 14:
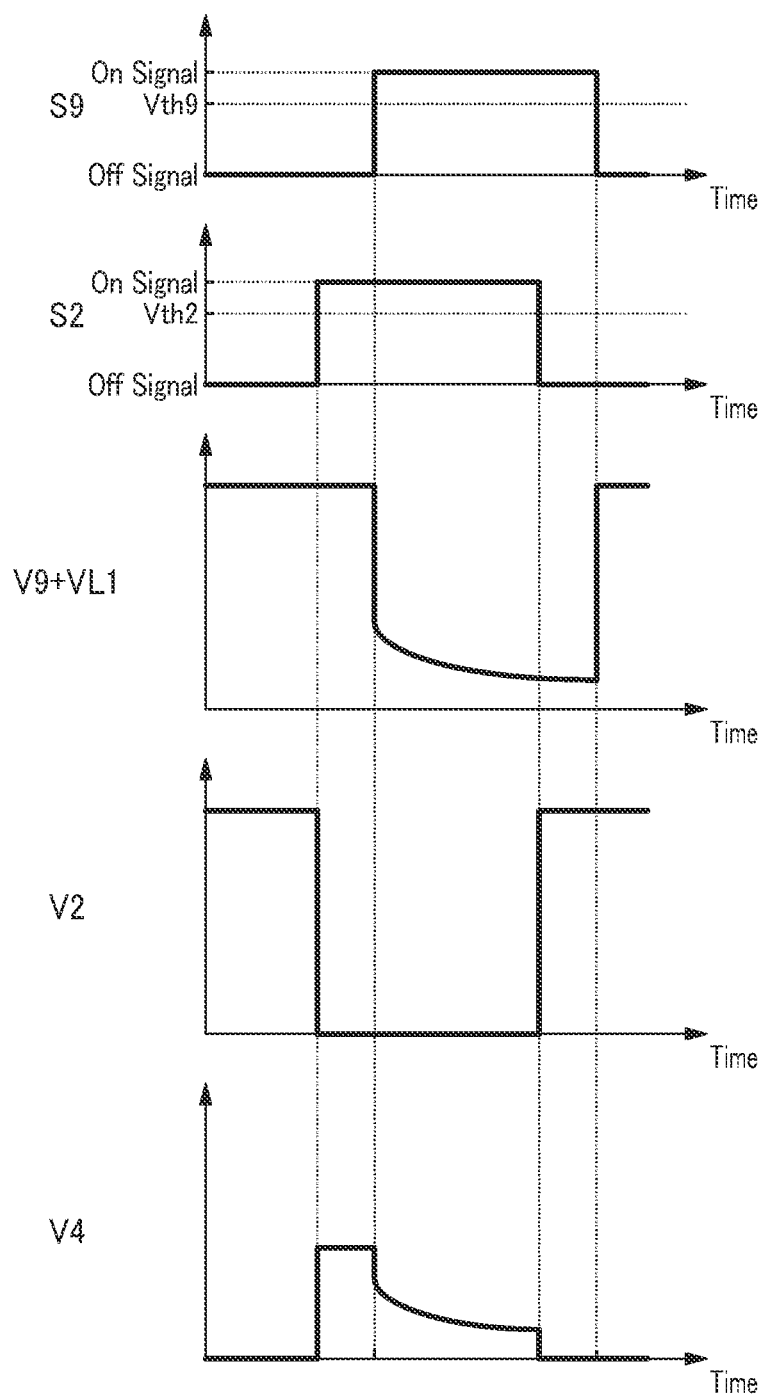
FIG. 14 is a timing chart showing how a switch system including the on-state voltage measurement circuit according to the fifth embodiment may also operate.

Optionally, the on-state voltage measurement circuit 1*d* may also operate in the same way by delaying the control signal S9 with respect to the control signal S2 (i.e., by causing a rising edge of the on signal of the control signal S9 to trail behind a corresponding rising edge of the on signal of the control signal S2) as shown in FIG. 14.

Sixth Embodiment

Figure 15:
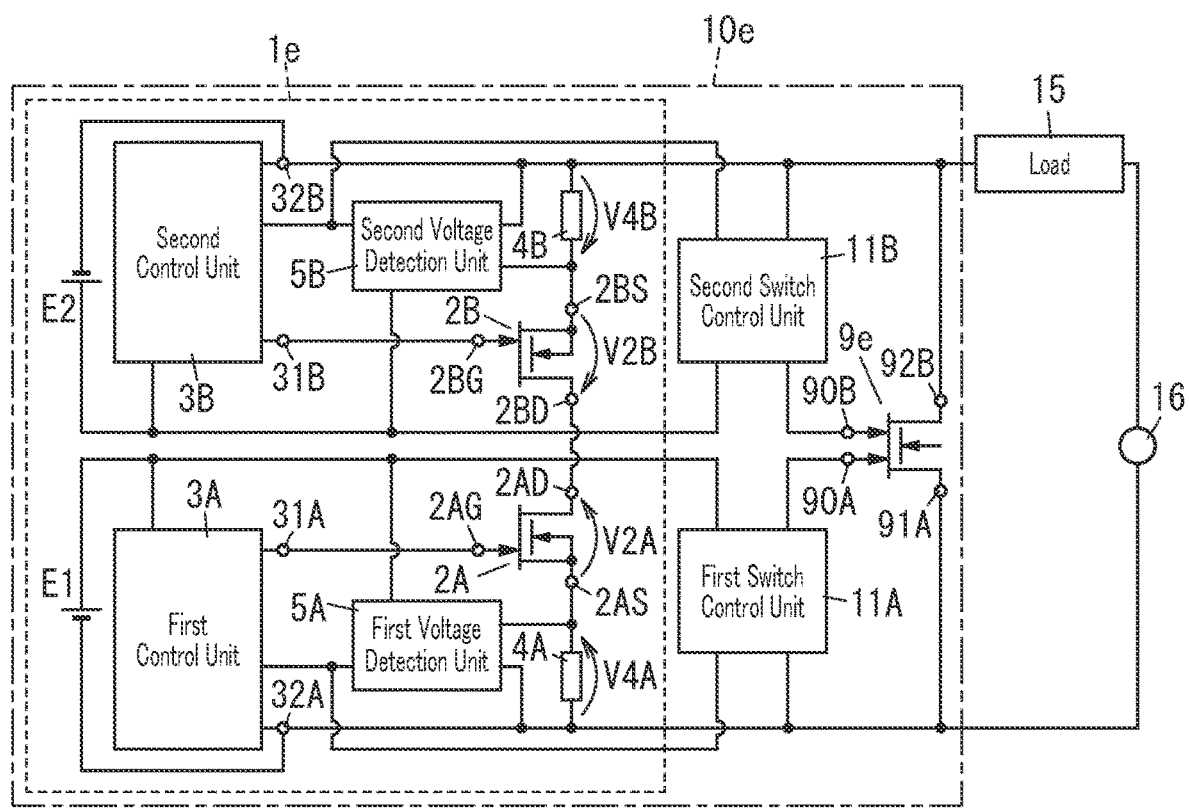
FIG. 15 is a circuit diagram of a switch system including an on-state voltage measurement circuit according to a sixth embodiment.

A switch system 10*e* including an on-state voltage measurement circuit 1*e* according to a sixth embodiment will now be described with reference to FIG. 15. The on-state voltage measurement circuit 1*e* according to the sixth embodiment uses a bidirectional switch element as the semiconductor switch element 9*e* under measurement and includes two sets, each consisting of a detecting switch element 2, a control unit 3, a resistive element 4, and a voltage detection unit 5 corresponding to their counterparts of the first embodiment, which is a difference from the on-state voltage measurement circuit 1 according to the first embodiment.

The on-state voltage measurement circuit 1*e* measures the on-state voltage of the semiconductor switch element 9*e* including a first control terminal 90A, a first main terminal 91A corresponding to the first control terminal 90A, a second control terminal 90B, and a second main terminal 92B corresponding to the second control terminal 90B. The on-state voltage is a voltage between the first main terminal 91A and the second main terminal 92B of the semiconductor switch element 9*e* in an on state.

The semiconductor switch element 9 is a dual-gate GaN-based GIT. The GaN-based GIT includes, for example, a GaN-based GIT chip and a package. The GaN-based GIT chip includes, for example, a substrate, a buffer layer, a first nitride semiconductor layer, a second nitride semiconductor layer, a first source electrode, a first gate electrode, a second gate electrode, a second source electrode, a first p-type layer, and a second p-type layer. The first nitride semiconductor layer may be, for example, a GaN layer. The second nitride semiconductor layer may be, for example, an AlGaN layer. The first p-type layer may be, for example, a p-type AlGaN layer. The second p-type layer may be, for example, a p-type AlGaN layer. The first nitride semiconductor layer is formed over the substrate with the buffer layer interposed between them. The second nitride semiconductor layer is formed on the first nitride semiconductor layer. The second nitride semiconductor layer has a larger bandgap than the first nitride semiconductor layer. The first source electrode is formed on the second nitride semiconductor layer. The first gate electrode is formed over the second nitride semiconductor layer and spaced from the first source electrode. The second gate electrode is also formed over the second nitride semiconductor layer and spaced from the first gate electrode so as to be located opposite from the first source electrode with respect to the first gate electrode. The second source electrode is formed on the second nitride semiconductor layer and spaced from the second gate electrode so as to be located opposite from the first gate electrode with respect to the second gate electrode. The first p-type layer is interposed between the first gate electrode and the second nitride semiconductor layer. The second p-type layer is interposed between the second gate electrode and the second nitride semiconductor layer. The first p-type layer and the second p-type layer cover the surface of the second nitride semiconductor layer only partially. In the semiconductor switch element 9*e*, the first control terminal 90A thereof is a first gate terminal, to which the first gate electrode is connected. The second control terminal 90B thereof is a second gate terminal, to which the second gate electrode is connected. The first main terminal 91A thereof is a first source terminal, to which the first source electrode is connected. The second main terminal 92B thereof is a second source terminal, to which the second source electrode is connected.

The on-state voltage measurement circuit 1*e* includes a first detecting switch element 2A, a first control unit 3A, a first resistive element 4A, a first voltage detection unit 5A, a second detecting switch element 2B, a second control unit 3B, a second resistive element 4B, and a second voltage detection unit 5B. The first detecting switch element 2A includes a first drain terminal 2AD, a first source terminal 2AS, and a first gate terminal 2AG. The first control unit 3A includes a first signal output terminal 31A and a first reference potential terminal 32A and controls the first detecting switch element 2A. The first resistive element 4A is connected between the first source terminal 2AS and the first reference potential terminal 32A. The second detecting switch element 2B includes a second drain terminal 2BD, a second source terminal 2BS, and a second gate terminal 2BG. The second control unit 3B includes a second signal output terminal 31B and a second reference potential terminal 32B and controls the second detecting switch element 2B. The second resistive element 4B is connected between the second source terminal 2BS and the second reference potential terminal 32B. In the on-state voltage measurement circuit 1*e*, the first drain terminal 2AD of the first detecting switch element 2A and the second drain terminal 2BD of the second detecting switch element 2B are connected to each other.

Each of the first detecting switch element 2A and the second detecting switch element 2B is a normally-off switch element. In this embodiment, each of the first detecting switch element 2A and the second detecting switch element 2B, as well as the detecting switch element 2 of the on-state voltage measurement circuit 1 according to the first embodiment, may be a normally-off JFET. More specifically, each of the first detecting switch element 2A and the second detecting switch element 2B is a GaN-based GIT. In FIG. 15, V2A denotes the voltage between the first drain terminal 2AD and the first source terminal 2AS of the first detecting switch element 2A. Also, in FIG. 15, V2B denotes the voltage between the second drain terminal 2BD and the second source terminal 2BS of the second detecting switch element 2B.

The first control unit 3A turns the first detecting switch element 2A off when the semiconductor switch element 9*e* is off and turns the first detecting switch element 2A on when the semiconductor switch element 9*e* is on. The first voltage detection unit 5A detects, based on the voltage V4A across the first resistive element 4A when the semiconductor switch element 9*e* and the first detecting switch element 2A are both on, the on-state voltage of the semiconductor switch element 9*e* connected between the first drain terminal 2AD and the first reference potential terminal 32A. In this case, the on-state voltage of the semiconductor switch element 9 as detected by the first voltage detection unit 5A is a half of the on-state voltage of the semiconductor switch element 9e.

In the first control unit 3A, the first signal output terminal 31A thereof is connected to the first gate terminal 2AG of the first detecting switch element 2A. In addition, in the first control unit 3A, the first reference potential terminal 32A thereof is connected to the first source terminal 2AS of the first detecting switch element 2A via the first resistive element 4A. To turn the first detecting switch element 2A on, the first control unit 3A outputs, as a control signal, an on signal to turn the first detecting switch element 2A on. The on signal that turns the first detecting switch element 2A on is a voltage signal having a voltage level (of 5 V, for example) that makes the gate voltage of the first detecting switch element 2A (i.e., the voltage between the first gate terminal 2AG and the first source terminal 2AS) greater than the threshold voltage of the first detecting switch element 2A. To turn the first detecting switch element 2A off, the first control unit 3A outputs, as a control signal, an off signal to turn the first detecting switch element 2A off. The off signal that turns the first detecting switch element 2A off is a voltage signal having a voltage level (of 0 V, for example) that makes the gate voltage of the first detecting switch element 2A (i.e., the voltage between the first gate terminal 2AG and the first source terminal 2AS) less than the threshold voltage of the first detecting switch element 2A.

The first control unit 3A is also connected to the first voltage detection unit 5A. The first control unit 3A controls the first detecting switch element 2A based on the on-state voltage detected by the first voltage detection unit 5A. More specifically, when finding the on-state voltage detected by the first voltage detection unit 5A equal to or greater than a threshold value, the first control unit 3A turns the first detecting switch element 2A off. In the switch system 10e including the on-state voltage measurement circuit 1e, when finding the on-state voltage detected by the first voltage detection unit 5A equal to or greater than the threshold value, the first switch control unit 11A turns the semiconductor switch element 9e off. The threshold value is a voltage value that has been set to detect any abnormality in the operation of the semiconductor switch element 9e in the on state.

The first control unit 3A includes a driver circuit for supplying a control signal to the first detecting switch element 2A. However, this is only an example and should not be construed as limiting.

The first control unit 3A includes a computer system. The computer system includes either a single computer or a plurality of computers. The computer system may include a processor and a memory as principal hardware components thereof. At least some functions of the first control unit 3A according to the present disclosure may be performed by making the processor execute a program stored in the memory of the computer system. The program may be stored in advance in the memory of the computer system. Alternatively, the program may also be downloaded through a telecommunications line or be distributed after having been recorded in some non-transitory storage medium such as a memory card, an optical disc, or a hard disk drive (magnetic disk), any of which is readable for the computer system. The processor of the computer system may be made up of a single or a plurality of electronic circuits including a semiconductor integrated circuit (IC) or a large-scale integrated circuit (LSI). Those electronic circuits may be either integrated together on a single chip or distributed on multiple chips, whichever is appropriate. Those multiple chips may be aggregated together in a single device or distributed in multiple devices without limitation.

The resistance value of the first resistive element 4A is greater than the on-state resistance of the first detecting switch element 2A. The resistance value of the first resistive element 4A may be, for example, ten times as high as the on-state resistance of the first detecting switch element 2A.

The first voltage detection unit 5A is connected across the first resistive element 4A. The first voltage detection unit 5A detects, based on the voltage V4A across the first resistive element 4A when the semiconductor switch element 9e and the first detecting switch element 2A are both on, the on-state voltage of the semiconductor switch element 9e connected between the first drain terminal 2AD and the first reference potential terminal 32A. In this case, the on-state voltage of the semiconductor switch element 9e as detected by the first voltage detection unit 5A is a half of the on-state voltage of the semiconductor switch element 9e.

The first voltage detection unit 5A also has the capability of determining the condition of the semiconductor switch element 9e based on the on-state voltage detected. For example, when comparing the on-state voltage detected with a threshold value to find the on-state voltage less than the threshold value, the first voltage detection unit 5A decides that there be no abnormality in the operation of the semiconductor switch element 9e. On the other hand, when finding the on-state voltage equal to or greater than the threshold value, the first voltage detection unit 5A decides that there be some abnormality in the operation of the semiconductor switch element 9e. As used herein, if "there is no abnormality," it means that no abnormal current is flowing through the semiconductor switch element 9e. On the other hand, if "there is any abnormality," it means that an abnormal current is flowing through the semiconductor switch element 9e to make the voltage V9 greater than the on-state voltage V9 of the semiconductor switch element 9e through which no abnormal current is flowing. The first voltage detection unit 5A may include, for example, a first comparator for comparing the on-state voltage with the threshold value. In that case, the first voltage detection unit 5A is configured to receive the threshold value at an inverting input terminal of the first comparator and receive, at a non-inverting input terminal of the first comparator, the on-state voltage detected by the first voltage detection unit 5A (i.e., the voltage V4A across the first resistive element 4A). In the first voltage detection unit 5A, if the voltage V4A is equal to or greater than the threshold value, the output signal of the first comparator comes to have an H level. If the voltage V4A is less than the threshold values, then the output signal of the first comparator comes to have an L level. In the first voltage detection unit 5A, the output signal of the first comparator having the H level means that a decision has been made that an abnormal current be flowing through the semiconductor switch element 9e (i.e., there be some abnormality in the operation of the semiconductor switch element 9e). On the other hand, the output signal of the first comparator having the L level means that a decision has been made that no abnormal current be flowing through the semiconductor switch element 9e (i.e., there be no abnormality in the operation of the semiconductor switch element 9e). In the on-state voltage measurement circuit 1e, the output terminal of the first voltage detection unit 5A is connected to the first control unit 3A so that the decision made by the first voltage detection unit 5A is provided for the first control unit 3A. Also, in the switch system 10e, the output terminal of the first voltage detection unit 5A is connected to the first switch control unit 11A so that the decision made by the first voltage detection unit 5A is provided for the first switch control unit 11A.

The on-state voltage measurement circuit 1e includes a first DC power supply E1 for supplying a supply voltage to the first control unit 3A and the first voltage detection unit 5A.

The second control unit 3B turns the second detecting switch element 2B off when the semiconductor switch element 9e is off and turns the second detecting switch element 2B on when the semiconductor switch element 9e is on. The second voltage detection unit 5B detects, based on the voltage V4B across the second resistive element 4B when the semiconductor switch element 9e and the second detecting switch element 2B are both on, the on-state voltage of the semiconductor switch element 9e connected between the second drain terminal 2BD and the second reference potential terminal 32B. In this case, the on-state voltage of the semiconductor switch element 9 as detected by the second voltage detection unit 5B is a half of the on-state voltage of the semiconductor switch element 9e.

In the second control unit 3B, the second signal output terminal 31B thereof is connected to the second gate terminal 2BG of the second detecting switch element 2B. In addition, in the second control unit 3B, the second reference potential terminal 32B thereof is connected to the second source terminal 2BS of the second detecting switch element 2B via the second resistive element 4B. To turn the second detecting switch element 2B on, the second control unit 3B outputs, as a control signal, an on signal to turn the second detecting switch element 2B on. The on signal that turns the second detecting switch element 2B on is a voltage signal having a voltage level (of 5 V, for example) that makes the gate voltage of the second detecting switch element 2B (i.e., the voltage between the second gate terminal 2BG and the second source terminal 2BS) greater than the threshold voltage of the second detecting switch element 2B. To turn the second detecting switch element 2B off, the second control unit 3B outputs, as a control signal, an off signal to turn the second detecting switch element 2B off. The off signal that turns the second detecting switch element 2B off is a voltage signal having a voltage level (of 0 V, for example) that makes the gate voltage of the second detecting switch element 2B (i.e., the voltage between the second gate terminal 2BG and the second source terminal 2BS) less than the threshold voltage of the second detecting switch element 2B.

The second control unit 3B is also connected to the second voltage detection unit 5B. The second control unit 3B controls the second detecting switch element 2B based on the on-state voltage detected by the second voltage detection unit 5B. More specifically, when finding the on-state voltage detected by the second voltage detection unit 5B equal to or greater than a threshold value, the second control unit 3B turns the second detecting switch element 2B off. In the switch system 10e including the on-state voltage measurement circuit 1e, when finding the on-state voltage detected by the second voltage detection unit 5B equal to or greater than the threshold value, the second switch control unit 11B turns the semiconductor switch element 9e off. The threshold value is a voltage value that has been set to detect any abnormality in the operation of the semiconductor switch element 9e in the on state.

The second control unit 3B includes a second driver circuit for supplying a control signal to the second detecting switch element 2B. However, this is only an example and should not be construed as limiting.

The second control unit 3B includes a computer system. The computer system includes either a single computer or a plurality of computers. The computer system may include a processor and a memory as principal hardware components thereof. At least some functions of the second control unit 3B according to the present disclosure may be performed by making the processor execute a program stored in the memory of the computer system. The program may be stored in advance in the memory of the computer system. Alternatively, the program may also be downloaded through a telecommunications line or be distributed after having been recorded in some non-transitory storage medium such as a memory card, an optical disc, or a hard disk drive (magnetic disk), any of which is readable for the computer system. The processor of the computer system may be made up of a single or a plurality of electronic circuits including a semiconductor integrated circuit (IC) or a large-scale integrated circuit (LSI). Those electronic circuits may be either integrated together on a single chip or distributed on multiple chips, whichever is appropriate. Those multiple chips may be aggregated together in a single device or distributed in multiple devices without limitation.

The resistance value of the second resistive element 4B is greater than the on-state resistance of the second detecting switch element 2B. The resistance value of the second resistive element 4B may be, for example, ten times as high as the on-state resistance of the second detecting switch element 2B. The resistance value of the second resistive element 4B is the same as the resistance value of the first resistive element 4A. As used herein, the phrase "the same as" refers to not only a situation where the two resistance values are exactly the same but also the difference in the resistance value of the second resistive element 4B from the resistance value of the first resistive element 4A falls within the range of ±5% of the resistance value of the first resistive element 4A.

The second voltage detection unit 5B is connected across the second resistive element 4B. The second voltage detection unit 5B detects, based on the voltage V4B across the second resistive element 4B when the semiconductor switch element 9e and the second detecting switch element 2B are both on, the on-state voltage of the semiconductor switch element 9e connected between the second drain terminal 2BD and the second reference potential terminal 32B. In this case, the on-state voltage of the semiconductor switch element 9e as detected by the second voltage detection unit 5B is a half of the on-state voltage of the semiconductor switch element 9e.

The second voltage detection unit 5B also has the capability of determining the condition of the semiconductor switch element 9e based on the on-state voltage detected. For example, when comparing the on-state voltage detected with a threshold value to find the on-state voltage less than the threshold value, the second voltage detection unit 5B decides that there be no abnormality in the operation of the semiconductor switch element 9e. On the other hand, when finding the on-state voltage equal to or greater than the threshold value, the second voltage detection unit 5B decides that there be some abnormality in the operation of the semiconductor switch element 9e. As used herein, if "there is no abnormality," it means that no abnormal current is flowing through the semiconductor switch element 9e. On the other hand, if "there is any abnormality," it means that an abnormal current is flowing through the semiconductor switch element 9e to make the voltage V9 greater than the voltage V9 at the semiconductor switch element 9e in the on state through which no abnormal current is flowing. The second voltage detection unit 5B may include, for example, a second comparator for comparing the on-state voltage with the threshold value. In that case, the second voltage detection unit 5B is configured to receive the threshold value at an inverting input terminal of the second comparator and receive, at a non-inverting input terminal of the second comparator, the on-state voltage detected by the second voltage detection unit 5B (i.e., the voltage V4B across the second resistive element 4B). In the second voltage detection unit 5B, if the voltage V4B is equal to or greater than the threshold value, the output signal of the second comparator comes to have an H level. If the voltage V4B is less than the threshold value, then the output signal of the second comparator comes to have an L level. In the second voltage detection unit 5B, the output signal of the second comparator having the H level means that a decision has been made that an abnormal current be flowing through the semiconductor switch element 9e (i.e., there be some abnormality in the operation of the semiconductor switch element 9e). On the other hand, the output signal of the second comparator having the L level means that a decision has been made that no abnormal current be flowing through the semiconductor switch element 9e (i.e., there be no abnormality in the operation of the semiconductor switch element 9e). In the on-state voltage measurement circuit 1e, the output terminal of the second voltage detection unit 5B is connected to the second control unit 3B so that the decision made by the second voltage detection unit 5B is provided for the second control unit 3B. Also, in the switch system 10e, the output terminal of the second voltage detection unit 5B is connected to the second switch control unit 11B so that the decision made by the second voltage detection unit 5B is provided for the second switch control unit 11B.

The on-state voltage measurement circuit 1e further includes a second DC power supply E2 for supplying a supply voltage to the second control unit 3B and the second voltage detection unit 5B.

In the switch system 10e including the on-state voltage measurement circuit 1e, a load circuit, including a series circuit of the load 15 and the power supply 16, for example, is connected between the first main terminal (first source terminal) 91A and the second main terminal (second source terminal) 92B of the semiconductor switch element 9e as a bidirectional switch element. The power supply 16 may be, for example, an AC power supply.

In the on-state voltage measurement circuit 1e, the first voltage detection unit 5A measures the on-state voltage of the semiconductor switch element 9e while a current is flowing from the second main terminal 92B of the semiconductor switch element 9e toward the first main terminal 91A thereof. In this embodiment, the first voltage detection unit 5A measures a half of the on-state voltage of the semiconductor switch element 9e. In addition, the first voltage detection unit 5A determines whether any abnormal current is flowing through the semiconductor switch element 9e while the current is flowing from the second main terminal 92B of the semiconductor switch element 9e toward the first main terminal 91A thereof.

In the on-state voltage measurement circuit 1e, the second voltage detection unit 5B measures the on-state voltage of the semiconductor switch element 9e while a current is flowing from the first main terminal 91A of the semiconductor switch element 9e toward the second main terminal 92B thereof. In this embodiment, the second voltage detection unit 5B measures a half of the on-state voltage of the semiconductor switch element 9e. In addition, the second voltage detection unit 5B determines whether any abnormal current is flowing through the semiconductor switch element 9e while the current is flowing from the first main terminal 91A of the semiconductor switch element 9e toward the second main terminal 92B thereof.

As can be seen from the foregoing description, the on-state voltage measurement circuit 1e according to the sixth embodiment contributes to improving the measurement accuracy of the on-state voltage. According to this embodiment, the on-state voltage measurement circuit 1e may measure the on-state voltage of the semiconductor switch element 9e irrespective of the direction in which a current is flowing through the semiconductor switch element 9e. In addition, the on-state voltage measurement circuit 1e may also determine, irrespective of the direction in which the current is flowing through the semiconductor switch element 9e, whether any abnormal current is flowing through the semiconductor switch element 9e.

A known dual-gate GaN-based GIT defines neither the H-level side nor the L-level side for the first source electrode and the second source electrode, and therefore, is not compatible with the protection circuit that uses the diode as disclosed in Patent Literature 1. In contrast, the on-state voltage measurement circuit 1e according to the sixth embodiment is a bidirectional on-state voltage measurement circuit compatible with the dual-gate GaN-based GIT.

Seventh Embodiment

Figure 16:
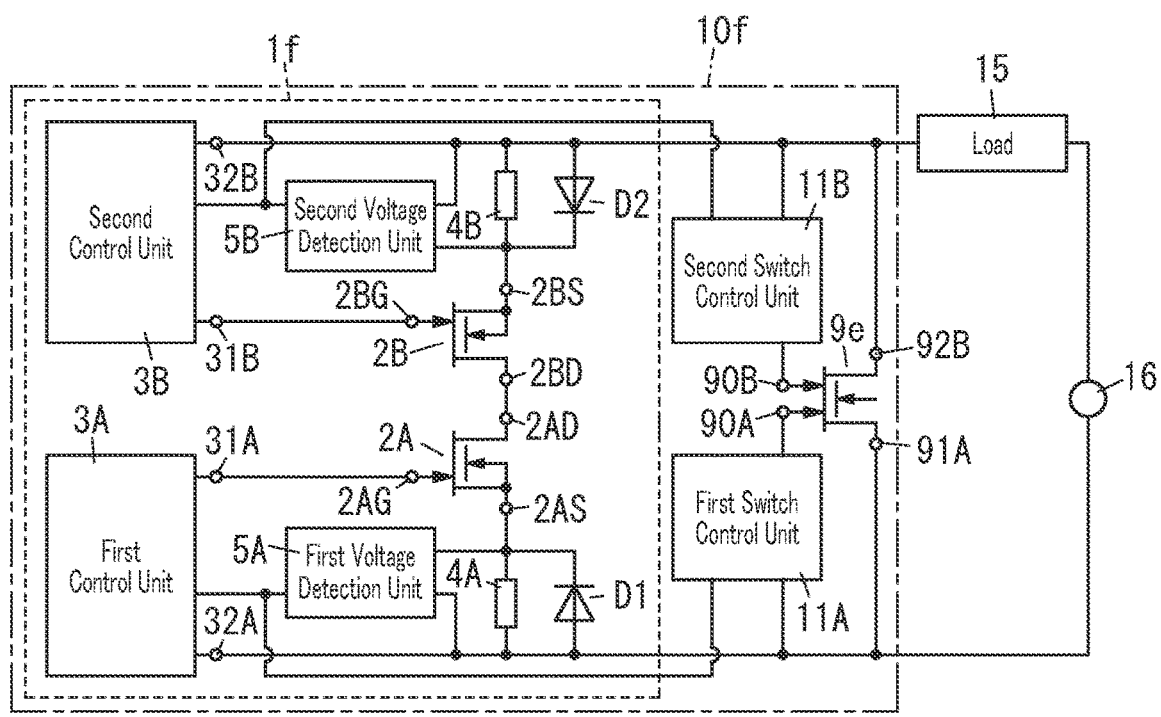
FIG. 16 is a circuit diagram of a switch system including an on-state voltage measurement circuit according to a seventh embodiment.

A switch system 10f including an on-state voltage measurement circuit 1f according to a seventh embodiment will now be described with reference to FIG. 16. In the following description, any constituent element of the on-state voltage measurement circuit 1f and switch system 10f according to this seventh embodiment, having the same function as a counterpart of the on-state voltage measurement circuit 1e and switch system 10e according to the sixth embodiment described above, will be designated by the same reference numeral as that counterpart's, and description thereof will be omitted herein as appropriate.

The on-state voltage measurement circuit 1f includes not only every circuit component of the on-state voltage measurement circuit 1e but also a first diode D1 and a second diode D2, which is a difference from the on-state voltage measurement circuit 1e.

The first diode D1 is connected to the first resistive element 4A in parallel. The first diode D1 includes a first anode and a first cathode. The first anode is connected to the first reference potential terminal 32A. The first cathode is connected to the first source terminal 2AS of the first detecting switch element 2A.

The second diode D2 is connected to the second resistive element 4B in parallel. The second diode D2 includes a second anode and a second cathode. The second anode is connected to the second reference potential terminal 32B. The second cathode is connected to the second source terminal 2BS of the second detecting switch element 2B. The forward voltage of the second diode D2 is the same as the forward voltage of the first diode D1. As used herein, the phrase "the same as" refers to not only a situation where the two voltages are exactly the same but also the difference in the forward voltage of the second diode D2 from the forward voltage of the first diode D1 falls within the range of ±10% of the forward voltage of the first diode D1.

In the on-state voltage measurement circuit 1f, the first diode D1 may clamp the voltage across the first resistive element 4A. The on-state voltage to be detected by the first voltage detection unit 5A is given by $$I1 \times Ron2A - VF1$$

where I1 is a current flowing through the first detecting switch element 2A, Ron2A is the on-state resistance of the first detecting switch element 2A, and VF1 is the forward voltage of the first diode D1. Thus, if I1×Ron2A is greater than 2×VF1, then the on-state voltage to be detected by the first voltage detection unit 5A increases as the current I1 increases.

In the on-state voltage measurement circuit 1f, the second diode D2 may clamp the voltage across the second resistive element 4B. The on-state voltage to be detected by the second voltage detection unit 5B is given by $$I2 \times Ron2B - VF2$$

where I2 is a current flowing through the second detecting switch element 2B, Ron2B is the on-state resistance of the second detecting switch element 2B, and VF2 is the forward voltage of the second diode D2. Thus, if I2×Ron2B is greater than 2×VF2, then the on-state voltage to be detected by the second voltage detection unit 5B increases as the current I2 increases.

The on-state voltage measurement circuit 1f according to the seventh embodiment contributes to improving the measurement accuracy of the on-state voltage.

In addition, in the on-state voltage measurement circuit 1f according to the seventh embodiment, the first diode D1 and the second diode D2 each form a clamp circuit. This eliminates the need to actively control the first detecting switch element 2A or the second detecting switch element 2B, thus contributing to reducing the number of parts required.

Eighth Embodiment

Figure 17:
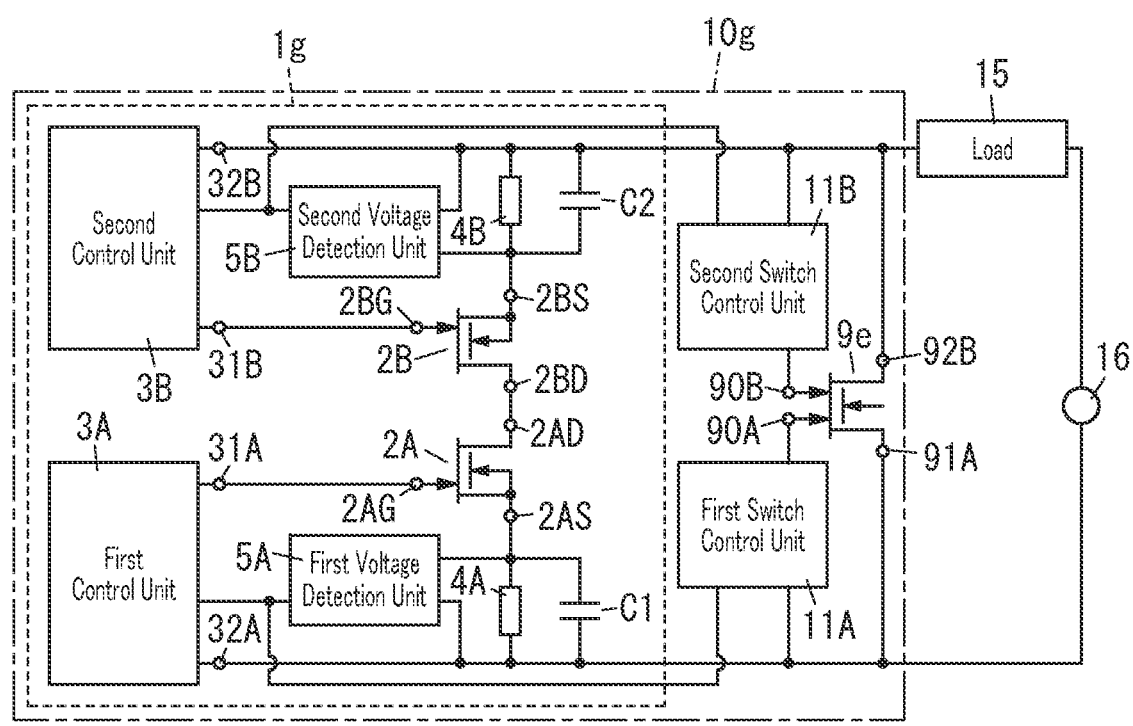
FIG. 17 is a circuit diagram of a switch system including an on-state voltage measurement circuit according to an eighth embodiment.

A switch system 10g including an on-state voltage measurement circuit 1g according to an eighth embodiment will now be described with reference to FIGS. 17, 18A, and 18B. In the following description, any constituent element of the on-state voltage measurement circuit 1g and switch system 10g according to this eighth embodiment, having the same function as a counterpart of the on-state voltage measurement circuit 1e and switch system 10e according to the sixth embodiment described above, will be designated by the same reference numeral as that counterpart's, and description thereof will be omitted herein as appropriate.

The on-state voltage measurement circuit 1g includes not only every circuit component of the on-state voltage measurement circuit 1e but also a first capacitor C1 and a second capacitor C2, which is a difference from the on-state voltage measurement circuit 1e.

The first capacitor C1 is connected to the first resistive element 4A in parallel. The second capacitor C2 is connected to the second resistive element 4B in parallel. The capacitance of the second capacitor C2 is the same as the capacitance of the first capacitor C1. As used herein, the phrase "the same as" refers to not only a situation where the two capacitances are exactly the same but also the difference in the capacitance of the second capacitor C2 from the capacitance the first capacitor C1 falls within the range of ±10% of the capacitance of the first capacitor C1.

Figure 19A:
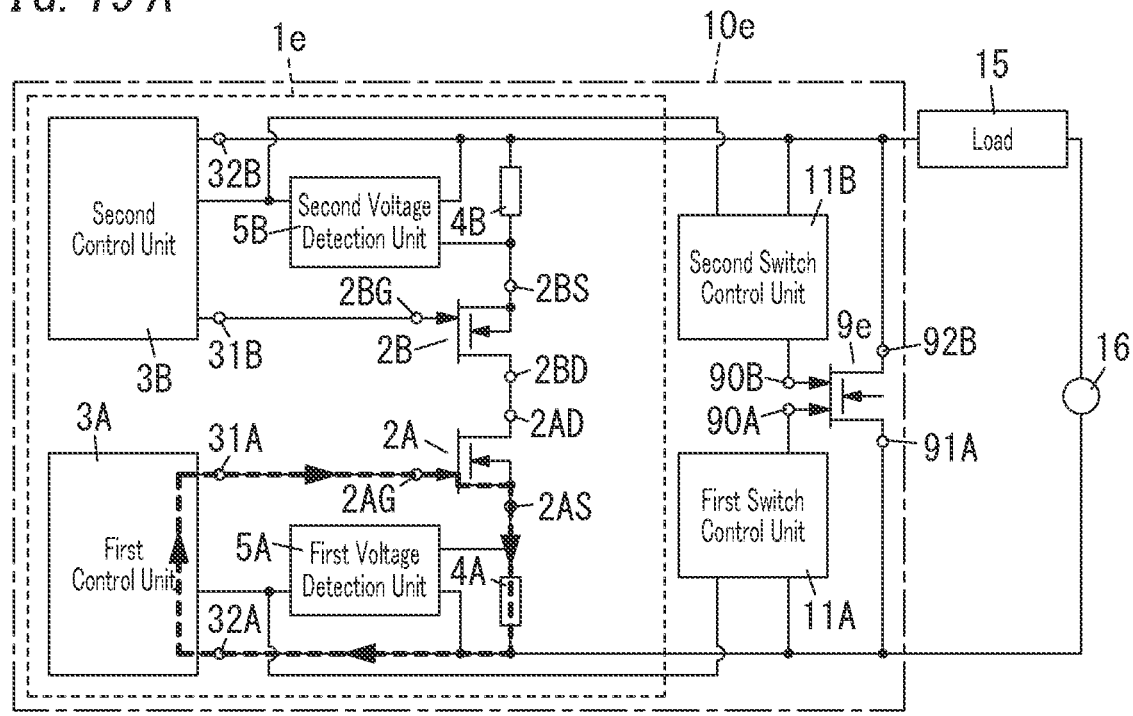
FIG. 19A illustrates how the on-state voltage measurement circuit including neither a first capacitor nor a second capacitor may operate.
Figure 19B:
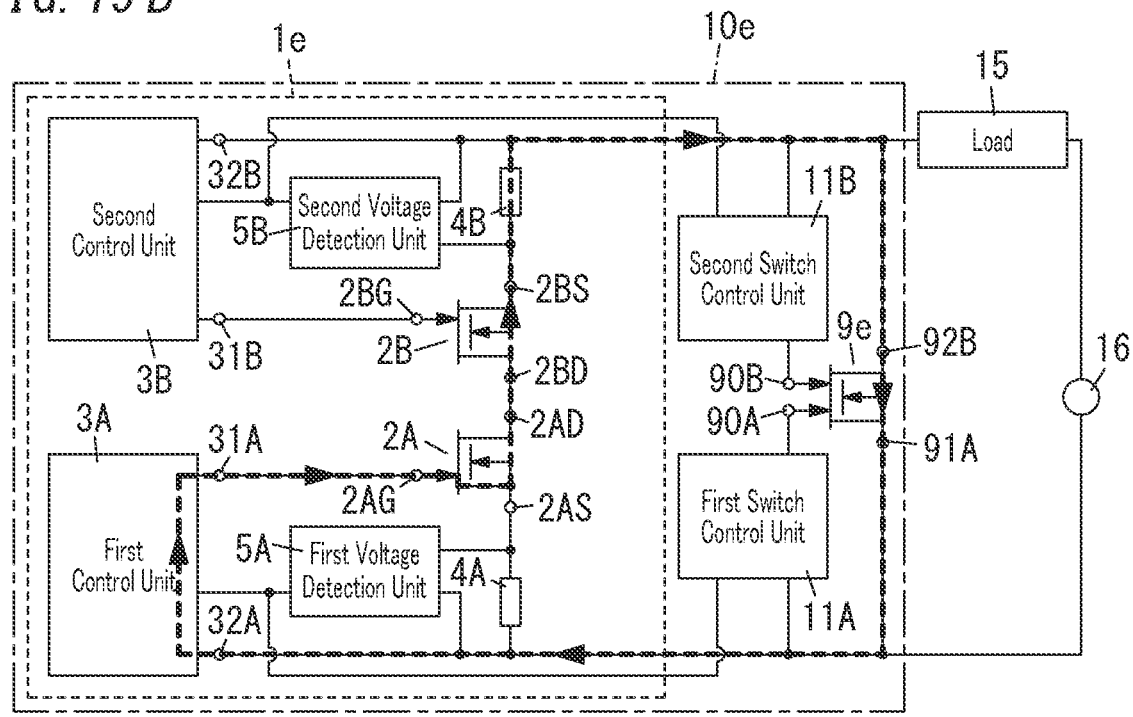
FIG. 19B illustrates how the on-state voltage measurement circuit including neither the first capacitor nor the second capacitor may operate.

In the on-state voltage measurement circuit 1e according to the sixth embodiment (refer to FIG. 15), a gate charging current flowing through the first gate terminal 2AG when turning the first detecting switch element 2A on, for example, may follow either the route indicated by the dashed arrow in FIG. 19A or the route indicated by the dashed arrow in FIG. 19B. In the on-state voltage measurement circuit 1e, when the gate charging current follows the route indicated by the dashed arrow in FIG. 19A, an inrush current entering the first gate terminal 2AG of the first detecting switch element 2A may flow through the first resistive element 4A, thus possibly causing the first voltage detection unit 5A to make a detection error. In addition, in the on-state voltage measurement circuit 1e, when the gate charging current follows the route indicated by the dashed arrow in FIG. 19B, an inrush current entering the second gate terminal 2BG of the second detecting switch element 2B may flow through the second resistive element 4B, thus possibly causing a decline in the measurement accuracy at the first voltage detection unit 5A. In the same way, the on-state voltage measurement circuit 1e may also cause a decline in the measurement accuracy at the second voltage detection unit 5B when turning the second detecting switch element 2B on, for example.

Figure 18A:
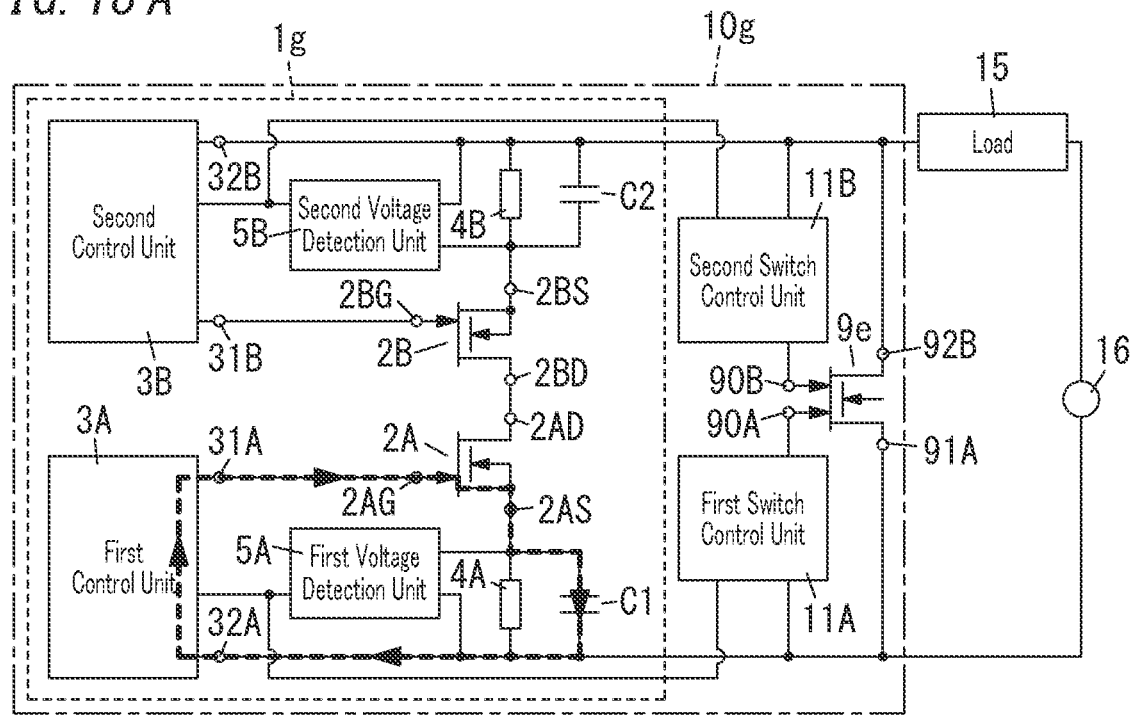
FIG. 18A illustrates how the switch system including the on-state voltage measurement circuit operates.
Figure 18B:
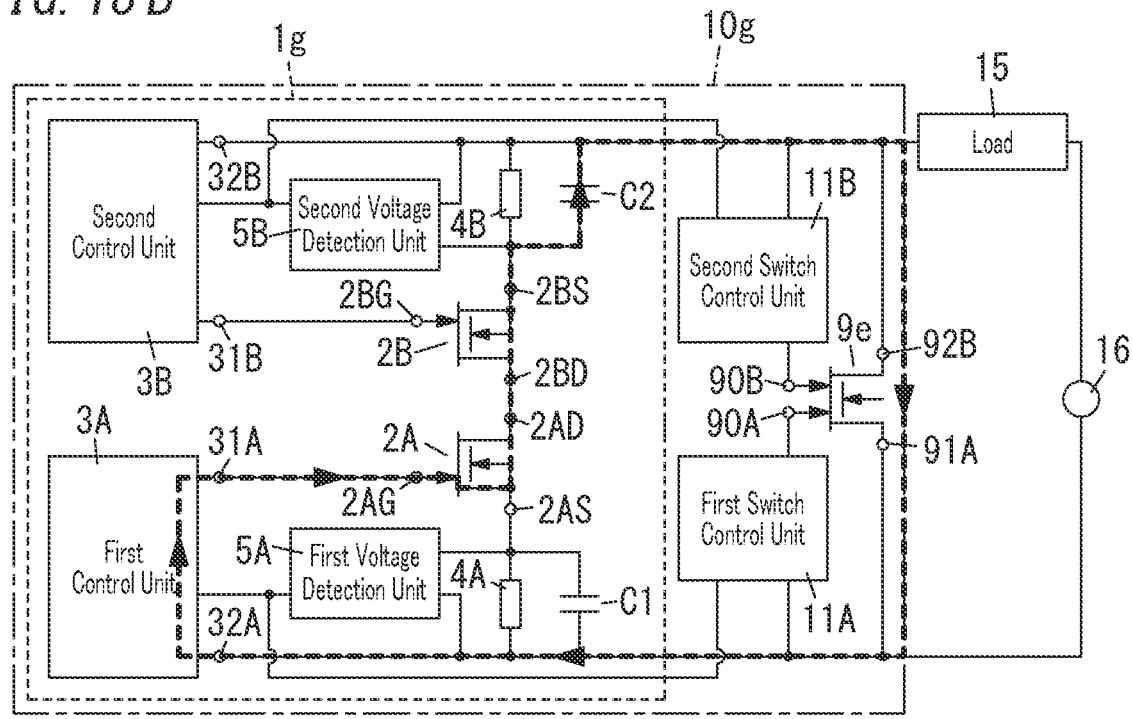
FIG. 18B illustrates how the switch system including the on-state voltage measurement circuit operates.

In contrast, in the on-state voltage measurement circuit 1g according to the eighth embodiment, a gate charging current flowing through the first gate terminal 2AG when turning the first detecting switch element 2A on, for example, may follow either the route indicated by the dashed arrow in FIG. 18A or the route indicated by the dashed arrow in FIG. 18B. In the on-state voltage measurement circuit 1g according to the eighth embodiment, when the gate charging current follows the route indicated by the dashed arrow in FIG. 18A, an inrush current entering the first gate terminal 2AG of the first detecting switch element 2A flows through the first capacitor C1, thus contributing to improving the measurement accuracy at the first voltage detection unit 5A. In addition, in the on-state voltage measurement circuit 1g according to the eighth embodiment, when the gate charging current follows the route indicated by the dashed arrow in FIG. 18B, an inrush current entering the second gate terminal 2BG of the second detecting switch element 2B flows through the second capacitor C2, thus contributing to improving the measurement accuracy at the first voltage detection unit 5A. In the same way, the on-state voltage measurement circuit 1g according to the eighth embodiment may also contribute to improving the measurement accuracy at the second voltage detection unit 5B when turning the second detecting switch element 2B on, for example.

Ninth Embodiment

Figure 20:
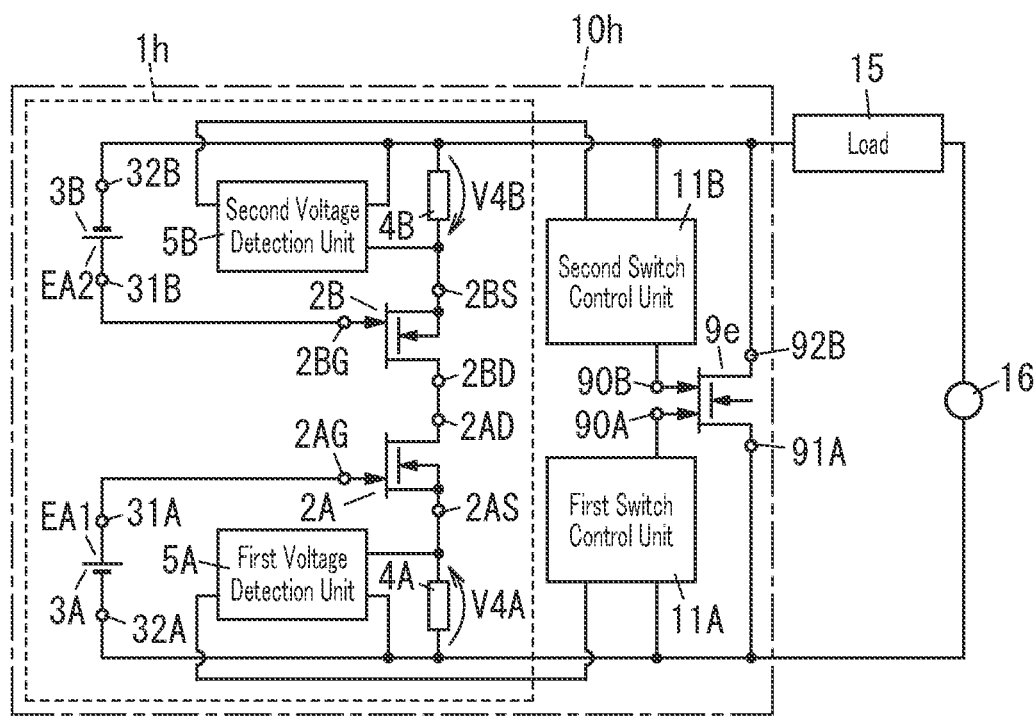
FIG. 20 is a circuit diagram of a switch system including an on-state voltage measurement circuit according to a ninth embodiment.

A switch system 10h including an on-state voltage measurement circuit 1h according to a ninth embodiment will now be described with reference to FIG. 20. In the following description, any constituent element of the on-state voltage measurement circuit 1h and switch system 10h according to this ninth embodiment, having the same function as a counterpart of the on-state voltage measurement circuit 1e and switch system 10e according to the sixth embodiment described above, will be designated by the same reference numeral as that counterpart's, and description thereof will be omitted herein as appropriate.

The on-state voltage measurement circuit 1h has the same circuit configuration as the on-state voltage measurement circuit 1e except that the first control unit 3A is implemented as a first constant voltage source EA1 and the second control unit 3B is implemented as a second constant voltage source EA2, which is a difference from the on-state voltage measurement circuit 1e.

The first signal output terminal 31A of the first control unit 3A is the positive electrode of the first constant voltage source EA1 and the first reference potential terminal 32A is the negative electrode of the first constant voltage source EA1. The first signal output terminal 31A of the first control unit 3A is connected to the first gate terminal 2AG of the first detecting switch element 2A. The first reference potential terminal 32A of the first control unit 3A is connected to the first source terminal 2AS of the first detecting switch element 2A via the first resistive element 4A.

The second signal output terminal 31B of the second control unit 3B is the positive electrode of the second constant voltage source EA2 and the second reference potential terminal 32B is the negative electrode of the second constant voltage source EA2. The second signal output terminal 31B of the second control unit 3B is connected to the second gate terminal 2BG of the second detecting switch element 2B. The second reference potential terminal 32B of the second control unit 3B is connected to the second source terminal 2BS of the second detecting switch element 2B via the second resistive element 4B.

The on-state voltage measurement circuit 1h according to this ninth embodiment, as well as the on-state voltage measurement circuit 1e according to the sixth embodiment, makes the first voltage detection unit 5A detect the voltage V4A across the first resistive element 4A and makes the second voltage detection unit 5B detect the voltage V4B across the second resistive element 4B, thus contributing to improving the measurement accuracy of the on-state voltage of the semiconductor switch element 9e.

In addition, in the on-state voltage measurement circuit 1h according to the ninth embodiment, the first constant voltage source EA1 and the first detecting switch element 2A serve as a clamp circuit, and the second constant voltage source EA2 and the second detecting switch element 2B serve as another clamp circuit. This eliminates the need to actively control the first detecting switch element 2A or the second detecting switch element 2B, thus contributing to reducing the number of parts required.

Tenth Embodiment

Figure 21:
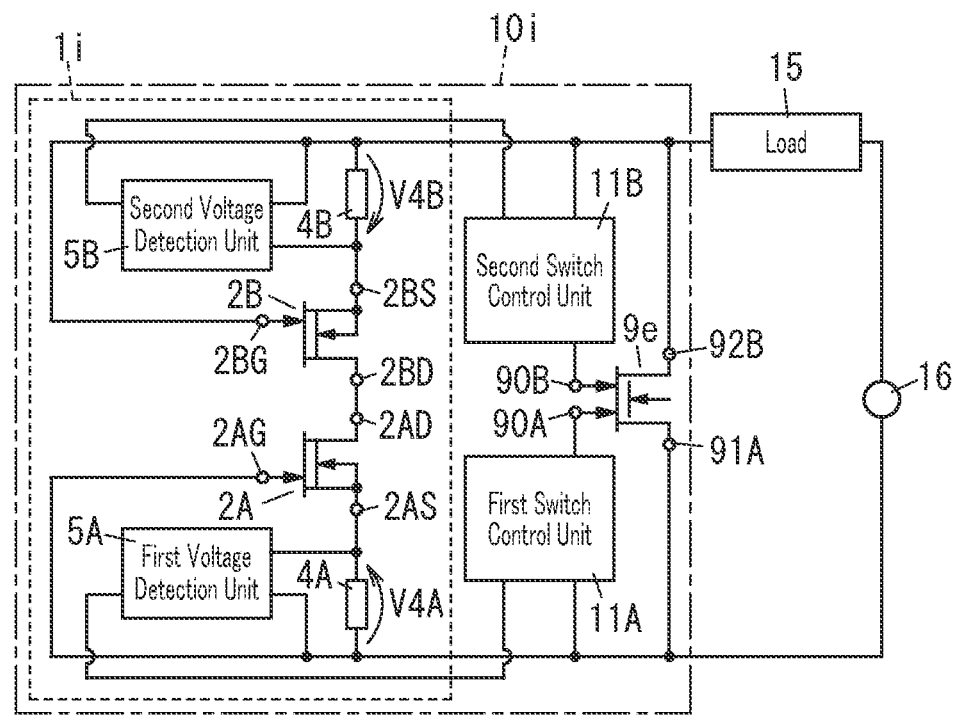
FIG. 21 is a circuit diagram of a switch system including an on-state voltage measurement circuit according to a tenth embodiment.

A switch system 10i including an on-state voltage measurement circuit 1i according to a tenth embodiment will now be described with reference to FIG. 21. In the following description, any constituent element of the on-state voltage measurement circuit 1i and switch system 10i according to this tenth embodiment, having the same function as a counterpart of the on-state voltage measurement circuit 1e and switch system 10e according to the sixth embodiment described above, will be designated by the same reference numeral as that counterpart's, and description thereof will be omitted herein as appropriate.

In the on-state voltage measurement circuit 1i, each of the first detecting switch element 2A and the second detecting switch element 2B is a normally-on switch element, which is a difference from the on-state voltage measurement circuit 1e. In addition, the on-state voltage measurement circuit 1i includes neither the first control unit 3A nor the second control unit 3B of the on-state voltage measurement circuit 1e, which is another difference from the on-state voltage measurement circuit 1e.

In the on-state voltage measurement circuit 1i, the first gate terminal 2AG of the normally-on first detecting switch element 2A is connected to the first source terminal 2AS of the first detecting switch element 2A via the first resistive element 4A.

In addition, in the on-state voltage measurement circuit 1i, the second gate terminal 2BG of the normally-on second detecting switch element 2B is connected to the second source terminal 2BS of the second detecting switch element 2B via the second resistive element 4B.

The on-state voltage measurement circuit 1i according to this tenth embodiment, as well as the on-state voltage measurement circuit 1e according to the sixth embodiment, makes the first voltage detection unit 5A detect the voltage V4A across the first resistive element 4A and makes the second voltage detection unit 5B detect the voltage V4B across the second resistive element 4B, thus contributing to improving the measurement accuracy of the on-state voltage of the semiconductor switch element 9e.

In addition, in the on-state voltage measurement circuit 1i according to the tenth embodiment, the first resistive element 4A and the normally-on first detecting switch element 2A serve as a clamp circuit, and the second resistive element 4B and the normally-on second detecting switch element 2B serve as another clamp circuit. This allows the number of power supplies required to be reduced, compared to the on-state voltage measurement circuit 1h according to the ninth embodiment.

Eleventh Embodiment

Figure 22:
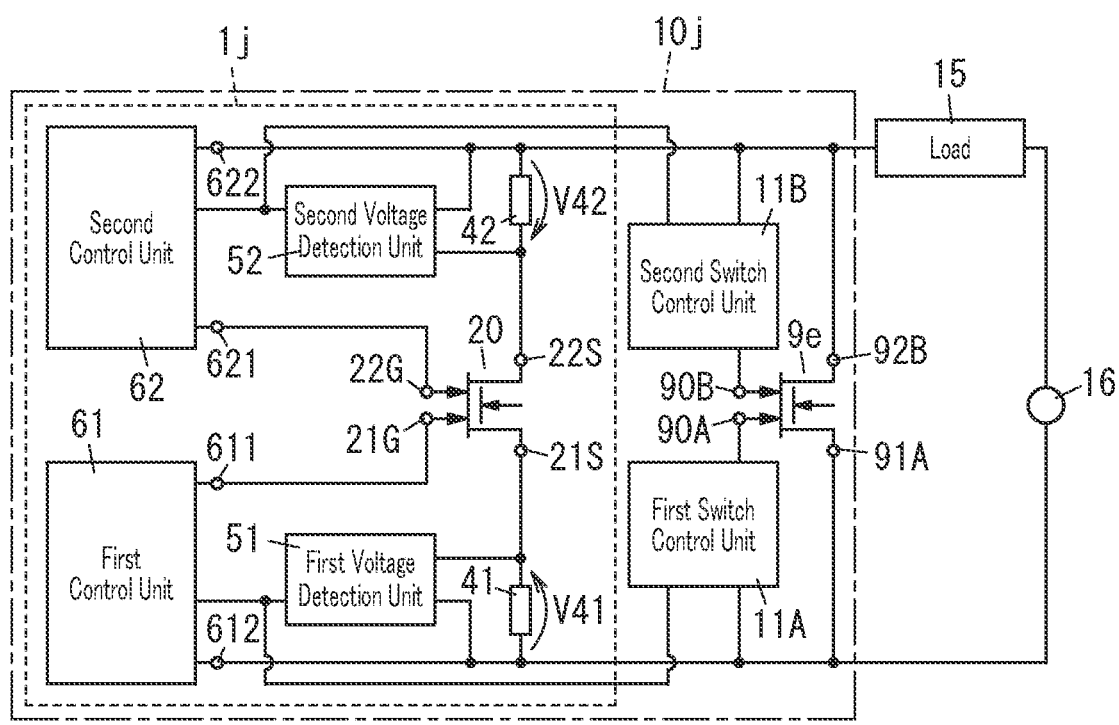
FIG. 22 is a circuit diagram of a switch system including an on-state voltage measurement circuit according to an eleventh embodiment.

A switch system 10j including an on-state voltage measurement circuit 1j according to an eleventh embodiment will now be described with reference to FIG. 22. In the following description, any constituent element of the on-state voltage measurement circuit 1j and switch system 10j according to this eleventh embodiment, having the same function as a counterpart of the on-state voltage measurement circuit 1e and switch system 10e according to the sixth embodiment described above, will be designated by the same reference numeral as that counterpart's, and description thereof will be omitted herein as appropriate.

The on-state voltage measurement circuit 1j includes a detecting switch element 20, a first control unit 61, a first resistive element 41, a first voltage detection unit 51, a second control unit 62, a second resistive element 42, and a second voltage detection unit 52.

The on-state voltage measurement circuit 1j includes the detecting switch element 20 instead of the series circuit of the first detecting switch element 2A and the second detecting switch element 2B in the on-state voltage measurement circuit 1e. The detecting switch element 20 includes a first gate terminal 21G, a first source terminal 21S corresponding to the first gate terminal 21G, a second gate terminal 22G, and a second source terminal 22S corresponding to the second gate terminal 22G. The detecting switch element 20, as well as the semiconductor switch element 9e, is implemented as a dual-gate GaN-based GIT. Thus, the detecting switch element 20 is a bidirectional switch element.

The first control unit 61 includes a first signal output terminal 611 and a first reference potential terminal 612 and controls a first gate voltage at the first gate terminal 21G of the detecting switch element 20.

The first control unit 61 includes a computer system. The computer system includes either a single computer or a plurality of computers. The computer system may include a processor and a memory as principal hardware components thereof. At least some functions of the first control unit 61 according to the present disclosure may be performed by making the processor execute a program stored in the memory of the computer system. The program may be stored in advance in the memory of the computer system. Alternatively, the program may also be downloaded through a telecommunications line or be distributed after having been recorded in some non-transitory storage medium such as a memory card, an optical disc, or a hard disk drive (magnetic disk), any of which is readable for the computer system. The processor of the computer system may be made up of a single or a plurality of electronic circuits including a semiconductor integrated circuit (IC) or a large-scale integrated circuit (LSI). Those electronic circuits may be either integrated together on a single chip or distributed on multiple chips, whichever is appropriate. Those multiple chips may be aggregated together in a single device or distributed in multiple devices without limitation.

The first resistive element 41 is connected between the first source terminal 21S of the detecting switch element 20 and the first reference potential terminal 612 of the first control unit 61. The resistance value of the first resistive element 41 is greater than the on-state resistance of the detecting switch element 20. It is preferable that the resistance value of the first resistive element 41 be, for example, at least nine times as large as the on-state resistance of the detecting switch element 20. For example, the resistance value of the first resistive element 41 is ten times as large as the on-state resistance of the detecting switch element 20.

The first voltage detection unit 51 detects, based on a voltage V41 across the first resistive element 41 when the semiconductor switch element 9e and the detecting switch element 20 are both on, the on-state voltage of the semiconductor switch element 9e connected between the first reference potential terminal 612 and the second reference potential terminal 622. In this case, the on-state voltage of the semiconductor switch element 9 as detected by the first voltage detection unit 51 is a half of the on-state voltage of the semiconductor switch element 9e.

The first voltage detection unit 51 also has the capability of determining the condition of the semiconductor switch element 9e based on the on-state voltage detected. For example, when comparing the on-state voltage detected with a threshold value to find the on-state voltage less than the threshold value, the first voltage detection unit 51 decides that there be no abnormality in the operation of the semiconductor switch element 9e. On the other hand, when finding the on-state voltage equal to or greater than the threshold value, the first voltage detection unit 51 decides that there be some abnormality in the operation of the semiconductor switch element 9e. As used herein, if "there is no abnormality," it means that no abnormal current is flowing through the semiconductor switch element 9e. On the other hand, if "there is any abnormality," it means that an abnormal current is flowing through the semiconductor switch element 9e to make the voltage V9 greater than the voltage V9 of the semiconductor switch element 9e in the on state, through which no abnormal current is flowing. The first voltage detection unit 51 may include, for example, a first comparator for comparing the on-state voltage with the threshold value. In that case, the first voltage detection unit 51 is configured to receive the threshold value at an inverting input terminal of the first comparator and receive, at a non-inverting input terminal of the first comparator, the on-state voltage detected by the first voltage detection unit 51 (i.e., the voltage V41 across the first resistive element 41). In the first voltage detection unit 51, if the voltage V41 is equal to or greater than the threshold value, the output signal of the first comparator comes to have an H level. If the voltage V41 is less than the threshold value, then the output signal of the first comparator comes to have an L level. In the first voltage detection unit 51, the output signal of the first comparator having the H level means that a decision has been made that an abnormal current be flowing through the semiconductor switch element 9e (i.e., there be some abnormality in the operation of the semiconductor switch element 9e). On the other hand, the output signal of the first comparator having the L level means that a decision has been made that no abnormal current be flowing through the semiconductor switch element 9e (i.e., there be no abnormality in the operation of the semiconductor switch element 9e). In the on-state voltage measurement circuit 1j, the output terminal of the first voltage detection unit 51 is connected to the first control unit 61 so that the decision made by the first voltage detection unit 51 is provided for the first control unit 61. Also, in the switch system 10j, the output terminal of the first voltage detection unit 51 is connected to the first switch control unit 11A so that the decision made by the first voltage detection unit 51 is provided for the first switch control unit 11A.

The second control unit 62 includes a second signal output terminal 621 and a second reference potential terminal 622. The second control unit 62 controls a second gate voltage at the second gate terminal 22G of the detecting switch element 20. The second control unit 62, as well as the first control unit 61, includes a computer system. The computer system includes either a single computer or a plurality of computers. The computer system may include a processor and a memory as principal hardware components thereof. At least some functions of the second control unit 62 according to the present disclosure may be performed by making the processor execute a program stored in the memory of the computer system.

The second resistive element 42 is connected between the second source terminal 22S and the second reference potential terminal 622. The resistance value of the second resistive element 42 is greater than the on-state resistance of the detecting switch element 20. It is preferable that the resistance value of the second resistive element 42 be, for example, at least nine times as large as the on-state resistance of the detecting switch element 20. For example, the resistance value of the second resistive element 42 is ten times as large as the on-state resistance of the detecting switch element 20. The resistance value of the second resistive element 42 is the same as the resistance value of the first resistive element 41. As used herein, the phrase "the same as" refers to not only a situation where the two resistance values are exactly the same but also the difference in the resistance value of the second resistive element 42 from the resistance value of the first resistive element 41 falls within the range of ±5% of the resistance value of the first resistive element 41.

The second voltage detection unit 52 detects, based on the voltage V42 across the second resistive element 42 when the semiconductor switch element 9e and the detecting switch element 20 are both on, the on-state voltage of the semiconductor switch element 9e connected between the first reference potential terminal 612 and the second reference potential terminal 622. In this case, the on-state voltage of the semiconductor switch element 9 as detected by the second voltage detection unit 52 is a half of the on-state voltage of the semiconductor switch element 9e.

The second voltage detection unit 52 also has the capability of determining the condition of the semiconductor switch element 9e based on the on-state voltage detected. For example, when comparing the on-state voltage detected with a threshold value to find the on-state voltage less than the threshold value, the second voltage detection unit 52 decides that there be no abnormality in the operation of the semiconductor switch element 9e. On the other hand, when finding the on-state voltage equal to or greater than the threshold value, the second voltage detection unit 52 decides that there be some abnormality in the operation of the semiconductor switch element 9e. As used herein, if "there is no abnormality," it means that no abnormal current is flowing through the semiconductor switch element 9e. On the other hand, if "there is any abnormality," it means that an abnormal current is flowing through the semiconductor switch element 9e to make the voltage V9 greater than the voltage V9 of the semiconductor switch element 9e in the on state, through which no abnormal current is flowing. The second voltage detection unit 52 may include, for example, a second comparator for comparing the on-state voltage with the threshold value. In that case, the second voltage detection unit 52 is configured to receive the threshold value at an inverting input terminal of the second comparator and receive, at a non-inverting input terminal of the second comparator, the on-state voltage detected by the second voltage detection unit 52 (i.e., the voltage V42 across the second resistive element 42). In the second voltage detection unit 52, if the voltage V42 is equal to or greater than the threshold value, the output signal of the second comparator comes to have an H level. If the voltage V42 is less than the threshold value, then the output signal of the second comparator comes to have an L level. In the second voltage detection unit 52, the output signal of the second comparator having the H level means that a decision has been made that an abnormal current be flowing through the semiconductor switch element 9e (i.e., there be some abnormality in the operation of the semiconductor switch element 9e). On the other hand, the output signal of the second comparator having the L level means that a decision has been made that no abnormal current be flowing through the semiconductor switch element 9e (i.e., there be no abnormality in the operation of the semiconductor switch element 9e). In the on-state voltage measurement circuit 1j, the output terminal of the second voltage detection unit 52 is connected to the second control unit 62 so that the decision made by the second voltage detection unit 52 is provided for the second control unit 62. Also, in the switch system 10j, the output terminal of the second voltage detection unit 52 is connected to the second switch control unit 11B so that the decision made by the second voltage detection unit 52 is provided for the second switch control unit 11B.

In the on-state voltage measurement circuit 1j according to the eleventh embodiment, a series circuit of the first resistive element 41, the detecting switch element 20, and the second resistive element 42 is connected to the semiconductor switch element 9e in parallel. This allows the first voltage detection unit 51 to measure, based on the voltage V41 across the first resistive element 41, the on-state voltage of the semiconductor switch element 9e and also allows the second voltage detection unit 52 to measure, based on the voltage V42 across the second resistive element 42, the on-state voltage of the semiconductor switch element 9e. Thus, the on-state voltage measurement circuit 1j, as well as the on-state voltage measurement circuit 1e according to the sixth embodiment, contributes to improving the measurement accuracy of the on-state voltage.

Twelfth Embodiment

Figure 23:
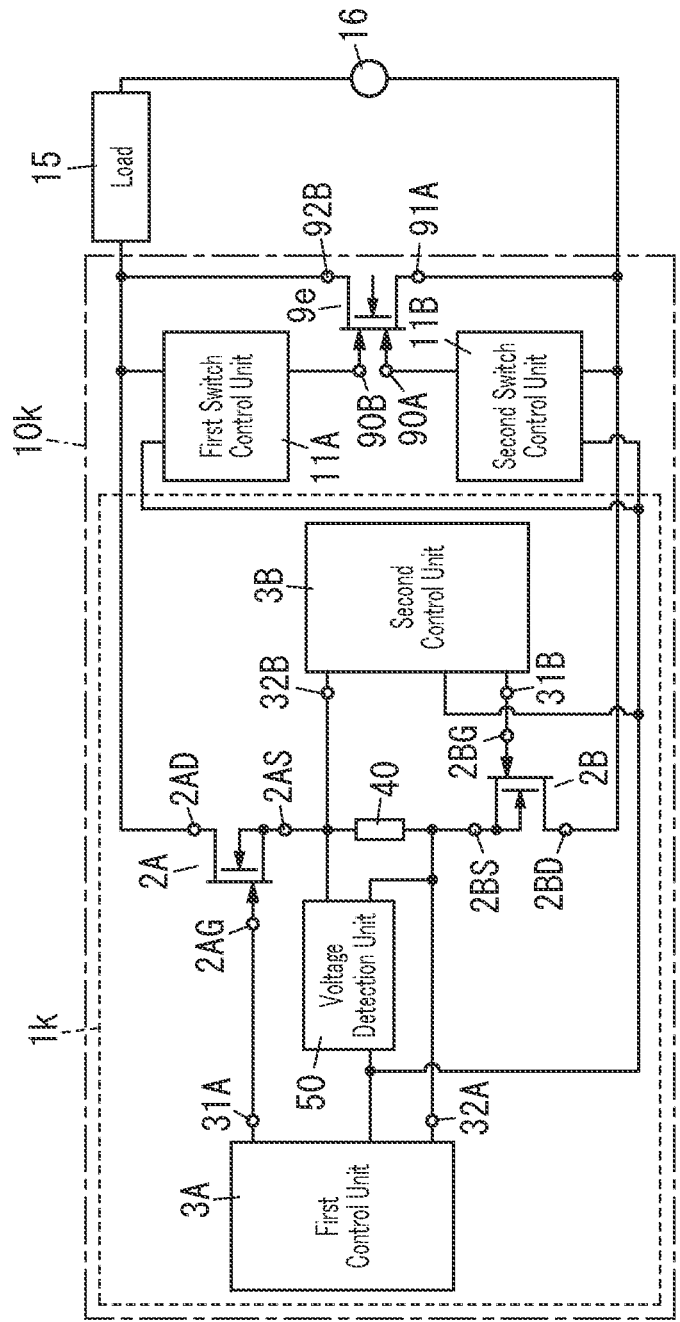
FIG. 23 is a circuit diagram of a switch system including an on-state voltage measurement circuit according to a twelfth embodiment.

A switch system 10k including an on-state voltage measurement circuit 1k according to a twelfth embodiment will now be described with reference to FIG. 23. In the following description, any constituent element of the on-state voltage measurement circuit 1k and switch system 10k according to this twelfth embodiment, having the same function as a counterpart of the on-state voltage measurement circuit 1e and switch system 10e according to the sixth embodiment described above, will be designated by the same reference numeral as that counterpart's, and description thereof will be omitted herein as appropriate.

The on-state voltage measurement circuit 1k includes a first detecting switch element 2A, a first control unit 3A, a second detecting switch element 2B, a second control unit 3B, a resistive element 40, and a voltage detection unit 50.

The first detecting switch element 2A includes a first drain terminal 2AD, a first source terminal 2AS, and a first gate terminal 2AG.

The first control unit 3A includes a first signal output terminal 31A and a first reference potential terminal 32A and controls the first detecting switch element 2A.

The second detecting switch element 2B includes a second drain terminal 2BD, a second source terminal 2BS, and a second gate terminal 2BG.

The second control unit 3B includes a second signal output terminal 31B and a second reference potential terminal 32B and controls the second detecting switch element 2B.

The resistive element 40 is connected between the first source terminal 2AS of the first detecting switch element 2A and the second source terminal 2BS of the second detecting switch element 2B.

In this on-state voltage measurement circuit 1k, the first signal output terminal 31A of the first control unit 3A is connected to the first gate terminal 2AG of the first detecting switch element 2A. The first reference potential terminal 32A of the first control unit 3A is connected to the second source terminal 2BS of the second detecting switch element 2B. The second signal output terminal 31B of the second control unit 3B is connected to the second gate terminal 2BG of the second detecting switch element 2B. The second reference potential terminal 32B of the second control unit 3B is connected to the first source terminal 2AS of the first detecting switch element 2A.

The resistance value of the resistive element 40 is greater than any one of an on-state resistance of the first detecting switch element 2A or an on-state resistance of the second detecting switch element 2B. The on-state resistance of the second detecting switch element 2B is the same as the on-state resistance of the first detecting switch element 2A. As used herein, the phrase "the same as" refers to not only a situation where the two on-state resistances are exactly the same but also the difference in the on-state resistance of the second detecting switch element 2B from the on-state resistance of the first detecting switch element 2A falls within the range of ±5% of the on-state resistance of the first detecting switch element 2A.

The resistance value of the resistive element 40 is preferably at least nine times as large as the sum of the respective on-state resistances of the first detecting switch element 2A and the second detecting switch element 2B. For example, the resistance value of the resistive element 40 may be ten times as large as the sum of the respective on-state resistances of the first detecting switch element 2A and the second detecting switch element 2B.

The voltage detection unit 50 detects, based on the voltage across the resistive element 40 when the semiconductor switch element 9e is on, the on-state voltage of the semiconductor switch element 9e connected between the first reference potential terminal 32A and the second reference potential terminal 32B. This allows the on-state voltage measurement circuit 1k to contribute to improving the measurement accuracy of the on-state voltage. In the switch system 10k including this on-state voltage measurement circuit 1k, the first switch control unit 11A and the second switch control unit 11B are connected to the output terminal of the voltage detection unit 50 and turns the semiconductor switch element 9e off when the on-state voltage detected by the voltage detection unit 50 becomes equal to or greater than a threshold value. The threshold value is a voltage value which has been set to detect any abnormality in the operation of the semiconductor switch element 9e in the on state.

Thirteenth Embodiment

Figure 24:
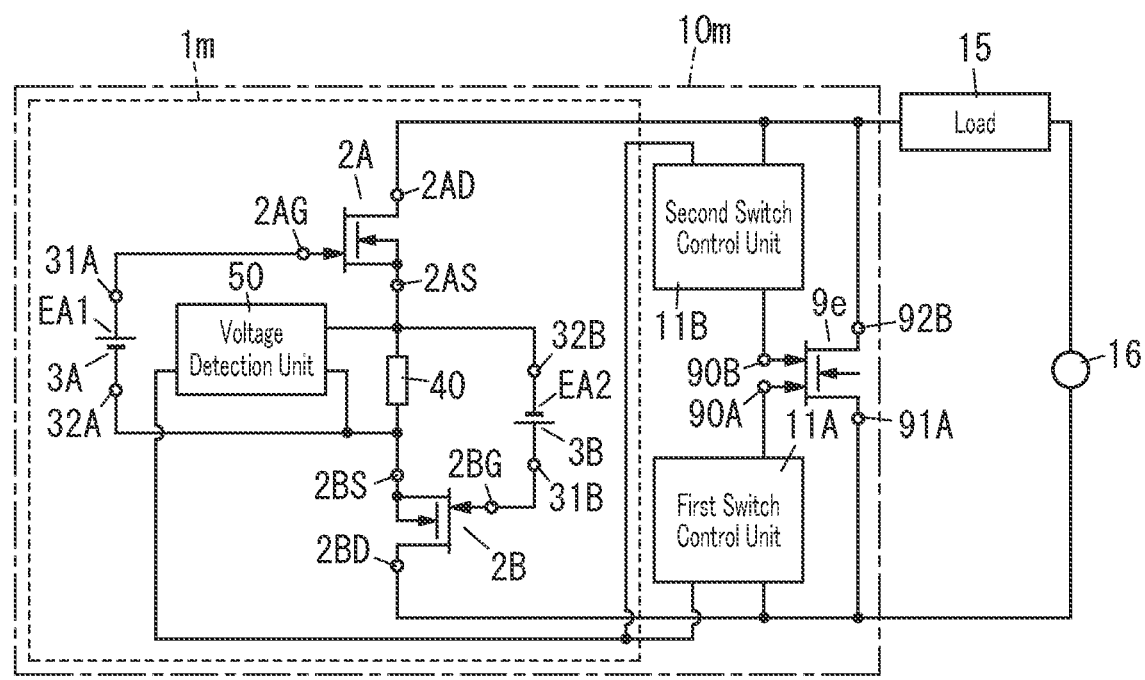
FIG. 24 is a circuit diagram of a switch system including an on-state voltage measurement circuit according to a thirteenth embodiment.

A switch system 10m including an on-state voltage measurement circuit 1m according to a thirteenth embodiment will now be described with reference to FIG. 24. In the following description, any constituent element of the on-state voltage measurement circuit 1m and switch system 10m according to this thirteenth embodiment, having the same function as a counterpart of the on-state voltage measurement circuit 1k and switch system 10k according to the twelfth embodiment described above, will be designated by the same reference numeral as that counterpart's, and description thereof will be omitted herein as appropriate.

The on-state voltage measurement circuit 1m has the same circuit configuration as the on-state voltage measurement circuit 1k except that the first control unit 3A is implemented as a first constant voltage source EA1 and the second control unit 3B is implemented as a second constant voltage source EA2, which is a difference from the on-state voltage measurement circuit 1k.

The first signal output terminal 31A of the first control unit 3A is the positive electrode of the first constant voltage source EA1 and the first reference potential terminal 32A thereof is the negative electrode of the first constant voltage source EA1. The first signal output terminal 31A of the first control unit 3A is connected to the first gate terminal 2AG of the first detecting switch element 2A. The first reference potential terminal 32A of the first control unit 3A is connected to the first source terminal 2AS of the first detecting switch element 2A via the resistive element 40.

The second signal output terminal 31B of the second control unit 3B is the positive electrode of the second constant voltage source EA2 and the second reference potential terminal 32B thereof is the negative electrode of the second constant voltage source EA2. The second signal output terminal 31B of the second control unit 3B is connected to the second gate terminal 2BG of the second detecting switch element 2B. The second reference potential terminal 32B of the second control unit 3B is connected to the second source terminal 2BS of the second detecting switch element 2B via the resistive element 40.

The on-state voltage measurement circuit 1m according to this thirteenth embodiment, as well as the on-state voltage measurement circuit 1k according to the twelfth embodiment, makes the voltage detection unit 50 detect the voltage across the resistive element 40, thus contributing to improving the measurement accuracy of the on-state voltage of the semiconductor switch element 9e.

In addition, in the on-state voltage measurement circuit 1m according to the thirteenth embodiment, the first constant voltage source EA1 and the first detecting switch element 2A serve as a clamp circuit, and the second constant voltage source EA2 and the second detecting switch element 2B serve as another clamp circuit. This eliminates the need to actively control the first detecting switch element 2A or the second detecting switch element 2B, thus contributing to reducing the number of parts required.

Fourteenth Embodiment

Figure 25:
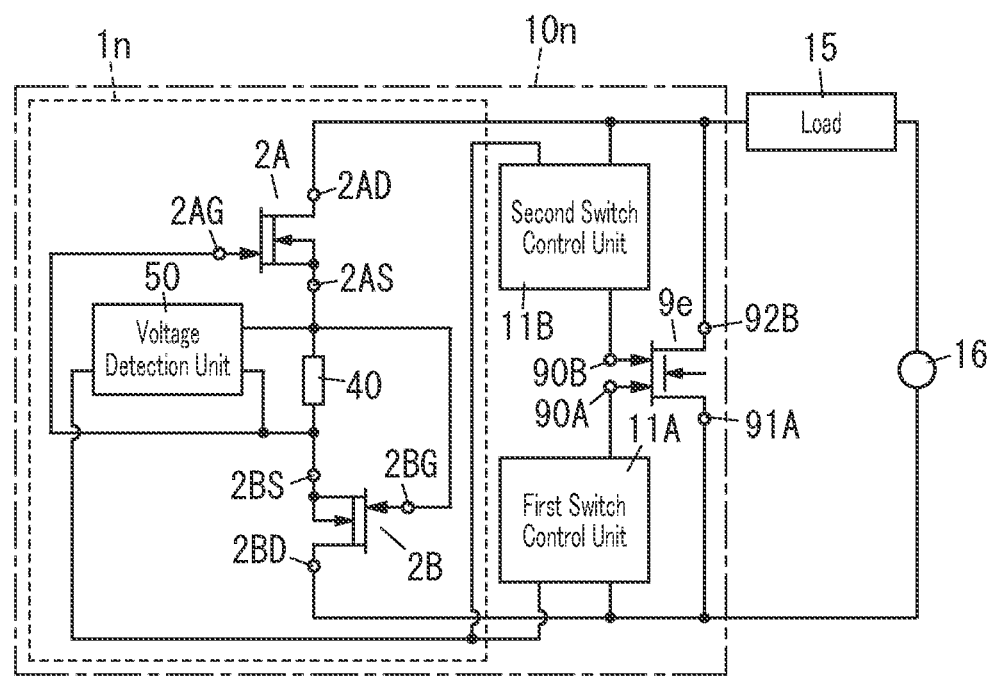
FIG. 25 is a circuit diagram of a switch system including an on-state voltage measurement circuit according to a fourteenth embodiment.

A switch system 10n including an on-state voltage measurement circuit 1n according to a fourteenth embodiment will now be described with reference to FIG. 25. In the following description, any constituent element of the on-state voltage measurement circuit 1n and switch system 10n according to this fourteenth embodiment, having the same function as a counterpart of the on-state voltage measurement circuit 1k and switch system 10k according to the twelfth embodiment described above, will be designated by the same reference numeral as that counterpart's, and description thereof will be omitted herein as appropriate.

In the on-state voltage measurement circuit 1n, each of the first detecting switch element 2A and the second detecting switch element 2B is a normally-on switch element, which is a difference from the on-state voltage measurement circuit 1k. In addition, the on-state voltage measurement circuit 1n includes neither the first control unit 3A nor the second control unit 3B of the on-state voltage measurement circuit 1k, which is another difference from the on-state voltage measurement circuit 1k.

In the on-state voltage measurement circuit 1n, the first gate terminal 2AG of the normally-on first detecting switch element 2A is connected to the first source terminal 2AS of the first detecting switch element 2A via the resistive element 40.

In addition, in the on-state voltage measurement circuit 1n, the second gate terminal 2BG of the normally-on second detecting switch element 2B is connected to the second source terminal 2BS of the second detecting switch element 2B via the resistive element 40.

The on-state voltage measurement circuit 1n according to this fourteenth embodiment, as well as the on-state voltage measurement circuit 1k according to the twelfth embodiment, makes the voltage detection unit 50 detect the voltage across the resistive element 40, thus contributing to improving the measurement accuracy of the on-state voltage of the semiconductor switch element 9e.

In addition, in the on-state voltage measurement circuit 1n according to the fourteenth embodiment, the resistive element 40 and the normally-on first detecting switch element 2A serve as a clamp circuit and the resistive element 40 and the normally-on second detecting switch element 2B serve as another clamp circuit. This reduces the number of power supplies required, compared to the on-state voltage measurement circuit 1m according to the thirteenth embodiment.

Variations

Note that the first to fourteenth embodiments described above are only exemplary ones of various embodiments of the present disclosure and should not be construed as limiting. Rather, the first to fourteenth embodiments may be readily modified in various manners depending on a design choice or any other factor without departing from the scope of the present disclosure. Optionally, multiple constituent elements of mutually different embodiments may be adopted in combination as appropriate.

For example, the semiconductor switch element 9 does not have to be a JFET but may also be a metal-oxide semiconductor field effect transistor (MOSFET) or an insulated gate bipolar transistor (IGBT).

Also, each of the detecting switch element 2, the first detecting switch element 2A, and the second detecting switch element 2B does not have to be a JFET but may also be a MOSFET or an IGBT.

Aspects

The first to fourteenth embodiments and their variations described above are specific implementations of the following aspects of the present disclosure.

An on-state voltage measurement circuit (1; 1*a*; 1*b*; 1*c*; 1*d*) according to a first aspect measures an on-state voltage of a semiconductor switch element (9) including a control terminal (90), a first main terminal (91), and a second main terminal (92). The on-state voltage is a voltage (V9) between the first main terminal (91) and the second main terminal (92) of the semiconductor switch element (9) in an on state. The on-state voltage measurement circuit (1; 1*a*; 1*b*) includes a detecting switch element (2), a control unit (3; 3*a*), a resistive element (4), and a voltage detection unit (5; 5*b*). The detecting switch element (2) includes a drain terminal (2D), a source terminal (2S), and a gate terminal (2G). The control unit (3; 3*a*) includes a signal output terminal (31) and a reference potential terminal (32) and controls the detecting switch element (2). The resistive element (4) is connected between the source terminal (2S) and the reference potential terminal (32). A resistance value (R4) of the resistive element (4) is greater than an on-state resistance (Ron2) of the detecting switch element (2). The voltage detection unit (5; 5*b*) detects, based on a voltage (V4) across the resistive element (4) when the semiconductor switch element (9) and the detecting switch element (2) are both on, the on-state voltage of the semiconductor switch element (9) connected between the drain terminal (2D) and the reference potential terminal (32).

The on-state voltage measurement circuit (1; 1*a*; 1*b*; 1*c*; 1*d*) according to the first aspect contributes to improving the measurement accuracy of the on-state voltage.

In an on-state voltage measurement circuit (1*a*) according to a second aspect, which may be implemented in conjunction with the first aspect, the control unit (3*a*) controls the semiconductor switch element (9).

The on-state voltage measurement circuit (1*a*) according to the second aspect makes it easier to perform the control of turning the detecting switch element (2) on or off in synch with the timing when the semiconductor switch element (9) turns on or off.

In an on-state voltage measurement circuit (1; 1*a*; 1*b*; 1*c*; 1*d*) according to a third aspect, which may be implemented in conjunction with the first or second aspect, the on-state voltage measurement circuit (1; 1*a*; 1*b*; 1*c*; 1*d*) measures an on-state voltage of a plurality of the semiconductor switch elements (9) that are connected in parallel.

The on-state voltage measurement circuit (1; 1*a*; 1*b*; 1*c*; 1*d*) according to the third aspect may measure the on-state voltage with the same voltage value of a plurality of semiconductor switch elements (9) that are connected in parallel.

In an on-state voltage measurement circuit (1*b*) according to a fourth aspect, which may be implemented in conjunction with any one of the first to third aspects, the voltage detection unit (5*b*) has a capability of comparing the on-state voltage detected with a threshold value (Vt). The voltage detection unit (5*b*) corrects the threshold value (Vt) according to a temperature of the semiconductor switch element (9). The temperature is detected by a temperature detection unit (19).

In the on-state voltage measurement circuit (1*b*) according to the fourth aspect, the voltage detection unit (5*b*) has the capability of comparing the on-state voltage detected with the threshold value (Vt) and may correct the threshold value (Vt) according to a variation in the temperature of the semiconductor switch element (9).

In an on-state voltage measurement circuit (1*c*) according to a fifth aspect, which may be implemented in conjunction with any one of the first, third, or fourth aspect, the on-state voltage measurement circuit (1*c*) makes, after the semiconductor switch element (9) has turned on, the control unit (3; 3*a*) output an on signal to turn the detecting switch element (2) on.

The on-state voltage measurement circuit (1*c*) according to the fifth aspect contributes to improving the measurement accuracy of the on-state voltage detected by the voltage detection unit (5).

An on-state voltage measurement circuit (1*c*) according to a sixth aspect, which may be implemented in conjunction with any one of the first to fourth aspects, further includes a gate resistor (121) and a gate capacitor (122). The gate resistor (121) is connected between the signal output terminal (31) and the gate terminal (2G) of the detecting switch element (2). The gate capacitor (122) is connected between the gate terminal (2G) and source terminal (2S) of the detecting switch element (2). The control terminal (90) of the semiconductor switch element (9) is connected to a driver (110) via a resistor (111), and a capacitor (112) is connected between the control terminal (90) and the second main terminal (92) of the semiconductor switch element (9). A time constant determined by the gate resistor (121) and the gate capacitor (122) is greater than a time constant determined by the resistor (111) and the capacitor (112).

The on-state voltage measurement circuit (1*c*) according to the sixth aspect contributes to improving the measurement accuracy of the on-state voltage detected by the voltage detection unit (5).

In an on-state voltage measurement circuit (1*c*) according to a seventh aspect, which may be implemented in conjunction with any one of the first to fourth aspects, a threshold voltage (Vth2) of the detecting switch element (2) is greater than a threshold voltage (Vth9) of the semiconductor switch element (9).

The on-state voltage measurement circuit (1*c*) according to the seventh aspect, having a simpler configuration than the sixth aspect, may turn the detecting switch element (2) on after the semiconductor switch element (9) has turned on.

In an on-state voltage measurement circuit (1*d*) according to an eighth aspect, which may be implemented in conjunction with any one of the first, third, or fourth aspect, the on-state voltage measurement circuit (1*d*) turns the detecting switch element (2) on by making the control unit (3; 3*a*) output an on signal before the semiconductor switch element (9) is turned on.

The on-state voltage measurement circuit (1*d*) according to the eighth aspect may detect, in response to occurrence of a current collapse phenomenon that the on-state resistance increases when the semiconductor switch element (9) is in on state, a variation in the on-state voltage with time due to the effect of the current collapse phenomenon.

An on-state voltage measurement circuit (1*d*) according to a ninth aspect, which may be implemented in conjunction with any one of the first to fourth aspects, further includes a gate resistor (121) and a gate capacitor (122). The gate resistor (121) is connected between the signal output terminal (31) and the gate terminal (2G) of the detecting switch element (2). The gate capacitor (122) is connected between the gate terminal (2G) and source terminal (2S) of the detecting switch element (2). The control terminal (90) of the semiconductor switch element (9) is connected to a driver (110) via a resistor (111) and a capacitor (112) is connected between the control terminal (90) and the second main terminal (92) of the semiconductor switch element (9). A time constant determined by the gate resistor (121) and the gate capacitor (122) is less than a time constant determined by the resistor (111) and the capacitor (112).

The on-state voltage measurement circuit (1d) according to the ninth aspect contributes to improving the measurement accuracy of the on-state voltage of the semiconductor switch element (9).

In an on-state voltage measurement circuit (1d) according to a tenth aspect, which may be implemented in conjunction with any one of the first to fourth aspects, a threshold voltage (Vth2) of the detecting switch element (2) is less than a threshold voltage (Vth9) of the semiconductor switch element (9).

The on-state voltage measurement circuit (1d) according to the tenth aspect, having a simpler configuration than the ninth aspect, may turn the detecting switch element (2) on before the semiconductor switch element (9) is turned on.

An on-state voltage measurement circuit (1e; 1f; 1g; 1h) according to an eleventh aspect measures an on-state voltage of a semiconductor switch element (9e) including a first control terminal (90A), a first main terminal (91A) corresponding to the first control terminal (90A), a second control terminal (90B), and a second main terminal (92B) corresponding to the second control terminal (90B). The on-state voltage is a voltage between the first main terminal (91A) and the second main terminal (92B) of the semiconductor switch element (9e) in an on state. The on-state voltage measurement circuit (1e; 1f; 1g; 1h) includes a first detecting switch element (2A), a first control unit (3A), a first resistive element (4A), a first voltage detection unit (5A), a second detecting switch element (2B), a second control unit (3B), a second resistive element (4B), and a second voltage detection unit (5B). The first detecting switch element (2A) includes a first drain terminal (2AD), a first source terminal (2AS), and a first gate terminal (2AG). The first control unit (3A) includes a first signal output terminal (31A) and a first reference potential terminal (32A) and controls the first detecting switch element (2A). The first resistive element (4A) is connected between the first source terminal (2AS) and the first reference potential terminal (32A). The second detecting switch element (2B) includes a second drain terminal (2BD), a second source terminal (2BS), and a second gate terminal (2BG). The second control unit (3B) includes a second signal output terminal (31B) and a second reference potential terminal (32B) and controls the second detecting switch element (2B). The second resistive element (4B) is connected between the second source terminal (2BS) and the second reference potential terminal (32B). In the on-state voltage measurement circuit (1e; 1f; 1g; 1h), the first drain terminal (2AD) of the first detecting switch element (2A) and the second drain terminal (2BD) of the second detecting switch element (2B) are connected to each other. A resistance value of the first resistive element (4A) is greater than an on-state resistance of the first detecting switch element (2A). A resistance value of the second resistive element (4B) is greater than an on-state resistance of the second detecting switch element (2B). The first voltage detection unit (5A) detects, based on a voltage (V4A) across the first resistive element (4A) when the semiconductor switch element (9e) and the first detecting switch element (2A) are both on, the on-state voltage of the semiconductor switch element (9e) connected between the first reference potential terminal (32A) and the second reference potential terminal (32B). The second voltage detection unit (5B) detects, based on a voltage (V4B) across the second resistive element (4B) when the semiconductor switch element (9e) and the second detecting switch element (2B) are both on, the on-state voltage of the semiconductor switch element (9e) connected between the first reference potential terminal (32A) and the second reference potential terminal (32B).

The on-state voltage measurement circuit (1e; 1f; 1g; 1h) according to the eleventh aspect contributes to improving the measurement accuracy of the on-state voltage.

An on-state voltage measurement circuit (1f) according to a twelfth aspect, which may be implemented in conjunction with the eleventh aspect, further includes a first diode (D1) and a second diode (D2). The first diode (D1) is connected to the first resistive element (4A) in parallel. The second diode (D2) is connected to the second resistive element (4B) in parallel. The first diode (D1) includes a first anode and a first cathode. The first anode is connected to the first reference potential terminal (32A). The first cathode is connected to the first source terminal (2AS) of the first detecting switch element (2A). The second diode (D2) includes a second anode and a second cathode. The second anode is connected to the second reference potential terminal (32B). The second cathode is connected to the second source terminal (2BS) of the second detecting switch element (2B).

In the on-state voltage measurement circuit (1f) according to the twelfth aspect, the first diode (D1) and the second diode (D2) each form a clamp circuit. Thus, the on-state voltage measurement circuit (1f) according to the twelfth aspect contributes to improving the measurement accuracy of the on-state voltage compared to a situation where the on-state voltage measurement circuit includes neither the first diode (D1) nor the second diode (D2).

An on-state voltage measurement circuit (1g) according to a thirteenth aspect, which may be implemented in conjunction with the eleventh aspect, further includes a first capacitor (C1) and a second capacitor (C2). The first capacitor (C1) is connected to the first resistive element (4A) in parallel. The second capacitor (C2) is connected to the second resistive element (4B) in parallel.

The on-state voltage measurement circuit (1g) according to the thirteenth aspect contributes to improving the measurement accuracy of the on-state voltage.

In an on-state voltage measurement circuit (1h) according to a fourteenth aspect, which may be implemented in conjunction with the eleventh aspect, the first control unit (3A) is a first constant voltage source (EA1), and the second control unit (3B) is a second constant voltage source (EA2).

The on-state voltage measurement circuit (1h) according to the fourteenth aspect may reduce the number of parts required.

An on-state voltage measurement circuit (1i) according to a fifteenth aspect measures an on-state voltage of a semiconductor switch element (9e) including a first control terminal (90A), a first main terminal (91A) corresponding to the first control terminal (90A), a second control terminal (90B), and a second main terminal (92) corresponding to the second control terminal (90B). The on-state voltage is a voltage between the first main terminal (91A) and the second main terminal (92B) of the semiconductor switch element (9e) in an on state. The on-state voltage measurement circuit (1i) includes a normally-on first detecting switch element (2A), a first resistive element (4A), a first voltage detection unit (5A), a normally-on second detecting switch element (2B), a second resistive element (4B), and a second voltage detection unit (5B). The first detecting switch element (2A) includes a first drain terminal (2AD), a first source terminal (2AS), and a first gate terminal (2AG). The first resistive element (4A) is connected between the first source terminal (2AS) and the first gate terminal (2AG). The second detecting switch element (2B) includes a second drain terminal (2BD), a second source terminal (2BS), and a second gate terminal (2BG). The second resistive element (4B) is connected between the second source terminal (2BS) and the second gate terminal (2BG). In the on-state voltage measurement circuit (1i), the first drain terminal (2AD) of the first detecting switch element (2A) and the second drain terminal (2BD) of the second detecting switch element (2B) are connected to each other. A resistance value of the first resistive element (4A) is greater than an on-state resistance of the first detecting switch element (2A). A resistance value of the second resistive element (4B) is greater than an on-state resistance of the second detecting switch element (2B). The first voltage detection unit (5A) detects, based on a voltage (V4A) across the first resistive element (4A) when the semiconductor switch element (9e) and the first detecting switch element (2A) are both on, the on-state voltage of the semiconductor switch element (9e) connected between the first gate terminal (2AG) and the second gate terminal (2BG). The second voltage detection unit (5B) detects, based on a voltage (V4B) across the second resistive element (4B) when the semiconductor switch element (9e) and the second detecting switch element (2B) are both on, the on-state voltage of the semiconductor switch element (9e) connected between the first gate terminal (2AG) and the second gate terminal (2BG).

The on-state voltage measurement circuit (1i) according to the fifteenth aspect contributes to improving the measurement accuracy of the on-state voltage. In addition, the on-state voltage measurement circuit (1i) according to the fifteenth aspect may also reduce the number of parts required, compared to the on-state voltage measurement circuit (1e; 1f; 1g; 1h) according to the eleventh aspect.

An on-state voltage measurement circuit (1j) according to a sixteenth aspect measures an on-state voltage of a semiconductor switch element (9e) including a first control terminal (90A), a first main terminal (91A) corresponding to the first control terminal (90A), a second control terminal (90B), and a second main terminal (92B) corresponding to the second control terminal (90B). The on-state voltage is a voltage between the first main terminal (91A) and the second main terminal (92B) of the semiconductor switch element (9e) in an on state. The on-state voltage measurement circuit (1j) includes a detecting switch element (20), a first control unit (61), a first resistive element (41), a first voltage detection unit (51), a second control unit (62), a second resistive element (42), and a second voltage detection unit (52). The detecting switch element (20) includes a first gate terminal (21G), a first source terminal (21S) corresponding to the first gate terminal (21G), a second gate terminal (22G), and a second source terminal (22S) corresponding to the second gate terminal (22G). The first control unit (61) includes a first signal output terminal (611) and a first reference potential terminal (612) and controls a first gate voltage at the first gate terminal (21G) of the detecting switch element (20). The first resistive element (41) is connected between the first source terminal (21S) and the first reference potential terminal (612). The second control unit (62) includes a second signal output terminal (621) and a second reference potential terminal (622) and controls a second gate voltage at the second gate terminal (22G) of the detecting switch element (20). The second resistive element (42) is connected between the second source terminal (22S) and the second reference potential terminal (622). A resistance value of the first resistive element (41) is greater than an on-state resistance of the detecting switch element (20). A resistance value of the second resistive element (42) is greater than the on-state resistance of the detecting switch element (20). The first voltage detection unit (51) detects, based on a voltage (V41) across the first resistive element (41) when the semiconductor switch element (9e) and the detecting switch element (20) are both on, the on-state voltage of the semiconductor switch element (9e) connected between the first reference potential terminal (612) and the second reference potential terminal (622). The second voltage detection unit (52) detects, based on a voltage (V42) across the second resistive element (42) when the semiconductor switch element (9e) and the detecting switch element (20) are both on, the on-state voltage of the semiconductor switch element (9e) connected between the first reference potential terminal (612) and the second reference potential terminal (622).

The on-state voltage measurement circuit (1j) according to the sixteenth aspect contributes to improving the measurement accuracy of the on-state voltage. In addition, the on-state voltage measurement circuit (1j) according to the sixteenth aspect may also reduce the number of parts required, compared to the on-state voltage measurement circuit (1e; 1f; 1g; 1h) according to the eleventh aspect.

An on-state voltage measurement circuit (1k) according to a seventeenth aspect measures an on-state voltage of a semiconductor switch element (9e) including a first control terminal (90A), a first main terminal (91A) corresponding to the first control terminal (90A), a second control terminal (90B), and a second main terminal (92B) corresponding to the second control terminal (90B). The on-state voltage is a voltage between the first main terminal (91A) and the second main terminal (92B) of the semiconductor switch element (9e) in an on state. The on-state voltage measurement circuit (1k) includes a first detecting switch element (2A), a first control unit (3A), a second detecting switch element (2B), a second control unit (3B), a resistive element (40), and a voltage detection unit (50). The first detecting switch element (2A) includes a first drain terminal (2AD), a first source terminal (2AS), and a first gate terminal (2AG). The first control unit (3A) includes a first signal output terminal (31A) and a first reference potential terminal (32A) and controls the first detecting switch element (2A). The second detecting switch element (2B) includes a second drain terminal (2BD), a second source terminal (2BS), and a second gate terminal (2BG). The second control unit (3B) includes a second signal output terminal (31B) and a second reference potential terminal (32B) and controls the second detecting switch element (2B). The resistive element (40) is connected between the first source terminal (2AS) of the first detecting switch element (2A) and the second source terminal (2BS) of the second detecting switch element (2B). The first signal output terminal (31A) of the first control unit (3A) is connected to the first gate terminal (2AG) of the first detecting switch element (2A). The first reference potential terminal (32A) of the first control unit (3A) is connected to the second source terminal (2BS) of the second detecting switch element (2B). The second signal output terminal (31B) of the second control unit (3B) is connected to the second gate terminal (2BG) of the second detecting switch element (2B). The second reference potential terminal (32B) of the second control unit (3B) is connected to the first source terminal (2AS) of the first detecting switch element (2A). A resistance value of the resistive element (40) is greater than any one of an on-state resistance of the first detecting switch element (2A) or an on-state resistance of the second detecting switch element (2B). The voltage detection unit (50) detects, based on a voltage across the resistive element (40) when the semiconductor switch element (9e) is on, the on-state voltage of the semiconductor switch element (9e) connected between the first reference potential terminal (32A) and the second reference potential terminal (32B).

The on-state voltage measurement circuit (1k) according to the seventeenth aspect contributes to improving the measurement accuracy of the on-state voltage.

In an on-state voltage measurement circuit (1m) according to an eighteenth aspect, which may be implemented in conjunction with the seventeenth aspect, the first control unit (3A) is a first constant voltage source (EA1), and the second control unit (3B) is a second constant voltage source (EA2).

The on-state voltage measurement circuit (1m) according to the eighteenth aspect may reduce the number of parts required.

An on-state voltage measurement circuit (In) according to a nineteenth aspect measures an on-state voltage of a semiconductor switch element (9e) including a first control terminal (90A), a first main terminal (91A) corresponding to the first control terminal (90A), a second control terminal (90B), and a second main terminal (92B) corresponding to the second control terminal (90B). The on-state voltage is a voltage between the first main terminal (91A) and the second main terminal (92B) of the semiconductor switch element (9e) in an on state. The on-state voltage measurement circuit (In) includes a normally-on first detecting switch element (2A), a normally-on second detecting switch element (2B), a resistive element 40, and a voltage detection unit (50). The first detecting switch element (2A) includes a first drain terminal (2AD), a first source terminal (2AS), and a first gate terminal (2AG). The second detecting switch element (2B) includes a second drain terminal (2BD), a second source terminal (2BS), and a second gate terminal (2BG). The resistive element (40) is connected between the first source terminal (2AS) of the first detecting switch element (2A) and the second source terminal (2BS) of the second detecting switch element (2B). In the on-state voltage measurement circuit (In), the first source terminal (2AS) of the first detecting switch element (2A) is connected to the second gate terminal (2BG) of the second detecting switch element (2B). The second source terminal (2BS) of the second detecting switch element (2B) is connected to the first gate terminal (2AG) of the first detecting switch element (2A). A resistance value of the resistive element (40) is greater than any one of an on-state resistance of the first detecting switch element (2A) or an on-state resistance of the second detecting switch element (2B). The voltage detection unit (50) detects, based on a voltage across the resistive element (40) when the semiconductor switch element (9e) is on, the on-state voltage of the semiconductor switch element (9e) connected between the first source terminal (2AS) and the second source terminal (2BS).

The on-state voltage measurement circuit (In) according to the nineteenth aspect contributes to improving the measurement accuracy of the on-state voltage. In addition, the on-state voltage measurement circuit (In) according to the nineteenth aspect may also reduce the number of parts required, compared to the on-state voltage measurement circuit (1k) according to the seventeenth aspect.

REFERENCE SIGNS LIST 1, 1a, 1b, 1c, 1d, 1e, 1f, 1g, 1h, 1i, 1j, 1k, 1m, 1n
 ON-State Voltage Measurement Circuit
2 Detecting Switch Element
2D Drain Terminal
2G Gate Terminal
2S Source Terminal
2A First Detecting Switch Element
2AD First Drain Terminal
2AG First Gate Terminal
2AS First Source Terminal
2B Second Detecting Switch Element
2BD Second Drain Terminal
2BG Second Gate Terminal
2BS Second Source Terminal
20 Detecting Switch Element
21G First Gate Terminal
21S First Source Terminal
22G Second Gate Terminal
22S Second Source Terminal
3, 3a Control Unit
31 Signal Output Terminal
32 Reference Potential Terminal
3A First Control Unit
31A First Signal Output Terminal
32A First Reference Potential Terminal
3B Second Control Unit
31B Second Signal Output Terminal
32B Second Reference Potential Terminal
4 Resistive Element
4A First Resistive Element
4B Second Resistive Element
40 Resistive Element
41 First Resistive Element
42 Second Resistive Element
5 Voltage Detection Unit
5A First Voltage Detection Unit
5B Second Voltage Detection Unit
50 Voltage Detection Unit
51 First Voltage Detection Unit
52 Second Voltage Detection Unit
61 First Control Unit
611 First Signal Output Terminal
612 First Reference Potential Terminal
62 Second Control Unit
62 Second Signal Output Terminal
622 Second Reference Potential Terminal
9, 9e Semiconductor Switch Element
90 Control Terminal
91 First Main Terminal
92 Second Main Terminal
90A First Control Terminal
91A First Main Terminal
90B Second Control Terminal
92B Second Main Terminal
10, 10a, 10b, 10c, 10d, 10e, 10f, 10g, 10h, 10i, 10j, 10k, 10m, 10n Switch System
11 Switch Control Unit
11A First Switch Control Unit
11B Second Switch Control Unit
15 Load
16 Power Supply
19 Temperature Detection Unit V2 Voltage
V4 Voltage
V4A Voltage
V4B Voltage
Vt Threshold Value
Vth2 Threshold Voltage
Vth9 Threshold Voltage

The invention claimed is:

1. An on-state voltage measurement circuit configured to measure an on-state voltage of a semiconductor switch element, the semiconductor switch element including a first control terminal, a first main terminal corresponding to the first control terminal, a second control terminal, and a second main terminal corresponding to the second control terminal, the on-state voltage being a voltage between the first main terminal and the second main terminal of the semiconductor switch element in an on state, the on-state voltage measurement circuit comprising:
 a first detecting switch element including a first drain terminal, a first source terminal, and a first gate terminal;
 a first control unit including a first signal output terminal and a first reference potential terminal and configured to control the first detecting switch element;
 a first resistive element connected between the first source terminal and the first reference potential terminal;
 a first voltage detection unit;
 a second detecting switch element including a second drain terminal, a second source terminal, and a second gate terminal;
 a second control unit including a second signal output terminal and a second reference potential terminal and configured to control the second detecting switch element;
 a second resistive element connected between the second source terminal and the second reference potential terminal; and
 a second voltage detection unit,
 the first drain terminal of the first detecting switch element and the second drain terminal of the second detecting switch element being connected to each other,
 a resistance value of the first resistive element being greater than an on-state resistance of the first detecting switch element,
 a resistance value of the second resistive element being greater than an on-state resistance of the second detecting switch element,
 the first voltage detection unit being configured to detect, based on a voltage across the first resistive element when the semiconductor switch element and the first detecting switch element are both on, the on-state voltage of the semiconductor switch element connected between the first reference potential terminal and the second reference potential terminal, and
 the second voltage detection unit being configured to detect, based on a voltage across the second resistive element when the semiconductor switch element and the second detecting switch element are both on, the on-state voltage of the semiconductor switch element connected between the first reference potential terminal and the second reference potential terminal.

2. The on-state voltage measurement circuit of claim 1, further comprising:
 a first diode connected to the first resistive element in parallel; and
 a second diode connected to the second resistive element in parallel, wherein
 the first diode includes a first anode and a first cathode, the first anode is connected to the first reference potential terminal, and the first cathode is connected to the first source terminal of the first detecting switch element,
 the second diode includes a second anode and a second cathode, the second anode is connected to the second reference potential terminal, and the second cathode is connected to the second source terminal of the second detecting switch element.

3. The on-state voltage measurement circuit of claim 1, further comprising:
 a first capacitor connected to the first resistive element in parallel; and
 a second capacitor connected to the second resistive element in parallel.

4. The on-state voltage measurement circuit of claim 1, wherein
 the first control unit is a first constant voltage source, and
 the second control unit is a second constant voltage source.

5. An on-state voltage measurement circuit configured to measure an on-state voltage of a semiconductor switch element, the semiconductor switch element including a first control terminal, a first main terminal corresponding to the first control terminal, a second control terminal, and a second main terminal corresponding to the second control terminal, the on-state voltage being a voltage between the first main terminal and the second main terminal of the semiconductor switch element in an on state, the on-state voltage measurement circuit comprising:
 a first detecting switch element including a first drain terminal, a first source terminal, and a first gate terminal;
 a first control unit including a first signal output terminal and a first reference potential terminal and configured to control the first detecting switch element;
 a second detecting switch element including a second drain terminal, a second source terminal, and a second gate terminal;
 a second control unit including a second signal output terminal and a second reference potential terminal and configured to control the second detecting switch element;
 a resistive element connected between the first source terminal of the first detecting switch element and the second source terminal of the second detecting switch element; and
 a voltage detection unit,
 the first signal output terminal of the first control unit being connected to the first gate terminal of the first detecting switch element,
 the first reference potential terminal of the first control unit being connected to the second source terminal of the second detecting switch element,
 the second signal output terminal of the second control unit being connected to the second gate terminal of the second detecting switch element,
 the second reference potential terminal of the second control unit being connected to the first source terminal of the first detecting switch element,
 a resistance value of the resistive element being greater than any one of an on-state resistance of the first detecting switch element or an on-state resistance of the second detecting switch element, and
 the voltage detection unit being configured to detect, based on a voltage across the resistive element when the semiconductor switch element is on, the on-state voltage of the semiconductor switch element connected between the first reference potential terminal and the second reference potential terminal.

6. The on-state voltage measurement circuit of claim 5, wherein
the first control unit is a first constant voltage source, and
the second control unit is a second constant voltage source.

\* \* \* \* \*